United States Patent
Lyon et al.

(10) Patent No.: US 9,943,014 B2
(45) Date of Patent: Apr. 10, 2018

(54) MANIFOLDED HEAT EXCHANGERS AND RELATED SYSTEMS

(71) Applicant: COOLIT SYSTEMS INC., Calgary (CA)

(72) Inventors: Geoff Sean Lyon, Calgary (CA); Mike Holden, Cochrane (CA); Brydon Gierl, Calgary (CA)

(73) Assignee: CoolIT Systems, Inc., Calgary (CA)

( * ) Notice: Subject to any disclaimer, the term of this patent is extended or adjusted under 35 U.S.C. 154(b) by 744 days.

(21) Appl. No.: 14/217,080

(22) Filed: Mar. 17, 2014

(65) Prior Publication Data

US 2014/0262180 A1    Sep. 18, 2014

Related U.S. Application Data

(60) Provisional application No. 61/794,698, filed on Mar. 15, 2013, provisional application No. 61/889,481, (Continued)

(51) Int. Cl.
*H05K 7/20* (2006.01)
*F28F 9/02* (2006.01)
(Continued)

(52) U.S. Cl.
CPC .......... *H05K 7/20781* (2013.01); *F28D 7/16* (2013.01); *F28D 15/00* (2013.01); *F28F 1/24* (2013.01);
(Continued)

(58) Field of Classification Search
CPC ....... H05K 7/20781; F28D 7/16; F28D 15/00; F28F 1/24; F28F 9/02; F28F 9/22; F28F 9/26
(Continued)

(56) References Cited

U.S. PATENT DOCUMENTS 3,481,393 A    12/1969   Chu
4,561,040 A    12/1985   Eastman et al.
(Continued)

FOREIGN PATENT DOCUMENTS

JP    61-32449 A       2/1986
JP    2002-151638 A    5/2002
(Continued)

OTHER PUBLICATIONS

Ellsworth, M.J. Jr. P.E., "Thermal Design and Implementation of Robust Liquid Cooling Systems for High Performance Computer Systems," Systems and Technology Group, IBM, InterPACK '11, pp. 1-64, (Jul. 6-8, 2011).
(Continued)

*Primary Examiner* — Raheena R Malik
(74) *Attorney, Agent, or Firm* — Ganz Pollard, LLC

(57) ABSTRACT

Some modular heat-transfer systems can have an array of at least one heat-transfer element being configured to transfer heat to a working fluid from a heat dissipator. A manifolded heat exchanger can be configured to receive heated working fluid from a plurality of heat-transfer elements and to reject heat to a working fluid of a second fluid circuit. In some embodiments, the heat exchanging manifold can split an incoming flow of working fluid from the second fluid circuit into two or more streams having different bulk flow directions. In some instances, heat exchanger portions of the heat exchanging manifold are configured to provide counter flow heat exchange between the working fluid of the first fluid circuit and the working fluid of the second fluid circuit.

20 Claims, 18 Drawing Sheets

Related U.S. Application Data filed on Oct. 10, 2013, provisional application No. 61/793,479, filed on Mar. 15, 2013, provisional application No. 61/805,418, filed on Mar. 26, 2013, provisional application No. 61/856,566, filed on Jul. 19, 2013, provisional application No. 61/880,081, filed on Sep. 19, 2013.

(51) Int. Cl.
| | |
|---|---|
| F28F 9/22 | (2006.01) |
| F28F 9/26 | (2006.01) |
| F28D 7/16 | (2006.01) |
| F28D 15/00 | (2006.01) |
| F28F 1/24 | (2006.01) |

(52) U.S. Cl.
CPC .................. *F28F 9/02* (2013.01); *F28F 9/22* (2013.01); *F28F 9/26* (2013.01)

(58) Field of Classification Search
USPC ........................................................ 165/164
See application file for complete search history.

(56) References Cited

U.S. PATENT DOCUMENTS

| | | | |
|---|---|---|---|
| 4,564,040 A | 1/1986 | Rudelick | |
| 4,750,086 A | 6/1988 | Mittal | |
| 4,898,153 A | 2/1990 | Sherwood | |
| 4,909,315 A | 3/1990 | Nelson et al. | |
| 4,940,085 A | 7/1990 | Nelson et al. | |
| 5,265,670 A | 11/1993 | Zingher | |
| 5,294,830 A | 3/1994 | Young et al. | |
| 5,309,319 A | 5/1994 | Messina | |
| 5,535,818 A | 7/1996 | Fujisaki et al. | |
| 5,646,824 A | 7/1997 | Ohashi et al. | |
| 5,684,671 A | 11/1997 | Hobbs et al. | |
| 5,727,618 A | 3/1998 | Mundinger et al. | |
| 5,823,249 A | 10/1998 | Batchelder | |
| 5,875,637 A * | 3/1999 | Paetow | F25B 1/053 62/117 |
| 6,019,165 A | 2/2000 | Batchelder | |
| 6,035,655 A * | 3/2000 | Hare | F25B 7/00 62/196.4 |
| 6,256,378 B1 | 7/2001 | Iggulden et al. | |
| 6,327,145 B1 | 12/2001 | Lian et al. | |
| 6,330,525 B1 | 12/2001 | Hays et al. | |
| 6,415,860 B1 | 7/2002 | Kelly et al. | |
| 6,447,270 B1 | 9/2002 | Schmidt et al. | |
| 6,470,289 B1 | 10/2002 | Peters et al. | |
| 6,679,315 B2 | 1/2004 | Cosley et al. | |
| 6,702,002 B2 | 3/2004 | Wang | |
| 6,769,258 B2 * | 8/2004 | Pierson | F01K 23/10 60/728 |
| 6,792,373 B2 | 9/2004 | Tabor | |
| 6,819,563 B1 | 11/2004 | Chu et al. | |
| 6,883,347 B2 * | 4/2005 | Ayub | F25B 39/02 165/159 |
| 6,952,345 B2 | 10/2005 | Weber et al. | |
| 6,973,801 B1 | 12/2005 | Campbell et al. | |
| 6,986,382 B2 | 1/2006 | Upadhya et al. | |
| 6,988,534 B2 | 1/2006 | Kenny et al. | |
| 7,000,684 B2 | 2/2006 | Kenny et al. | |
| 7,007,506 B2 | 3/2006 | Kubo et al. | |
| 7,012,807 B2 | 3/2006 | Chu et al. | |
| 7,021,367 B2 | 4/2006 | Oikawa | |
| 7,044,198 B2 | 5/2006 | Matsushima et al. | |
| 7,057,893 B2 | 6/2006 | Nicolai et al. | |
| 7,086,247 B2 | 8/2006 | Campbell et al. | |
| 7,104,312 B2 | 9/2006 | Goodson et al. | |
| 7,123,996 B2 | 10/2006 | Fukushima et al. | |
| 7,124,811 B2 | 10/2006 | Crocker et al. | |
| 7,131,486 B2 | 11/2006 | Goodson et al. | |
| 7,149,084 B2 | 12/2006 | Matsushima et al. | |
| 7,156,159 B2 | 1/2007 | Lovette et al. | |
| 7,209,355 B2 | 4/2007 | Koga et al. | |
| 7,221,270 B2 | 5/2007 | Chen et al. | |
| 7,264,359 B2 | 9/2007 | Kawahara et al. | |
| 7,274,566 B2 | 9/2007 | Campbell et al. | |
| 7,278,273 B1 | 10/2007 | Whitted et al. | |
| 7,301,771 B2 | 11/2007 | Hata et al. | |
| 7,315,448 B1 | 1/2008 | Bash et al. | |
| 7,318,322 B2 | 1/2008 | Ota et al. | |
| 7,397,661 B2 | 7/2008 | Campbell et al. | |
| 7,466,549 B2 | 12/2008 | Dorrich et al. | |
| 7,466,553 B2 | 12/2008 | Hamman | |
| 7,484,530 B2 | 2/2009 | Harvey et al. | |
| 7,527,085 B2 | 5/2009 | Iijima et al. | |
| 7,591,302 B1 | 9/2009 | Lenehan et al. | |
| 7,599,184 B2 | 10/2009 | Upadhya et al. | |
| 7,639,499 B1 | 12/2009 | Campbell et al. | |
| 7,688,589 B2 | 3/2010 | Chiang | |
| 7,757,506 B2 | 7/2010 | Ellsworth, Jr. et al. | |
| 7,762,314 B2 | 7/2010 | Campbell et al. | |
| 7,791,882 B2 | 9/2010 | Chu et al. | |
| 7,905,106 B2 | 3/2011 | Attlesey | |
| 7,925,746 B1 | 4/2011 | Melton | |
| 7,957,144 B2 | 6/2011 | Goettert et al. | |
| 7,961,465 B2 | 6/2011 | Goldrian | |
| 7,969,727 B2 | 6/2011 | Tozer et al. | |
| 7,971,632 B2 | 7/2011 | Eriksen | |
| 7,978,472 B2 | 7/2011 | Campbell et al. | |
| 8,066,057 B2 | 11/2011 | Olesen | |
| 8,240,362 B2 | 8/2012 | Eriksen | |
| 8,245,764 B2 | 8/2012 | Eriksen | |
| 8,250,879 B2 * | 8/2012 | MacBain | F25B 1/00 62/335 |
| 8,427,831 B2 | 4/2013 | Wei | |
| 8,437,129 B2 | 5/2013 | Tung et al. | |
| 8,441,789 B2 | 5/2013 | Wu et al. | |
| 8,493,738 B2 | 7/2013 | Chainer et al. | |
| 8,724,315 B2 | 5/2014 | Branton | |
| 9,496,200 B2 | 11/2016 | Lyon et al. | |
| 2002/0070007 A1 | 6/2002 | Calaman et al. | |
| 2003/0019234 A1 | 1/2003 | Wayburn et al. | |
| 2004/0008483 A1 | 1/2004 | Cheon | |
| 2004/0042171 A1 | 3/2004 | Takamatsu et al. | |
| 2004/0042172 A1 | 3/2004 | Kusaka et al. | |
| 2004/0057211 A1 | 3/2004 | Kondo et al. | |
| 2004/0104012 A1 | 6/2004 | Zhou et al. | |
| 2004/0123614 A1 | 7/2004 | Stewart | |
| 2004/0240179 A1 | 12/2004 | Koga et al. | |
| 2005/0126747 A1 | 6/2005 | Chu et al. | |
| 2005/0128705 A1 | 6/2005 | Chu et al. | |
| 2005/0180107 A1 | 8/2005 | Naganawa et al. | |
| 2005/0259397 A1 | 11/2005 | Bash et al. | |
| 2005/0269061 A1 | 12/2005 | Brewer et al. | |
| 2006/0002080 A1 | 1/2006 | Leija et al. | |
| 2006/0143439 A1 | 6/2006 | Arumugam et al. | |
| 2006/0225867 A1 | 10/2006 | Park et al. | |
| 2007/0095512 A1 * | 5/2007 | Chen | F25B 39/02 165/146 |
| 2007/0107886 A1 * | 5/2007 | Chen | F25B 39/02 165/161 |
| 2007/0163750 A1 | 7/2007 | Bhatti et al. | |
| 2007/0227710 A1 | 10/2007 | Belady et al. | |
| 2007/0256957 A1 | 11/2007 | Herrmann et al. | |
| 2007/0297136 A1 * | 12/2007 | Konshak | H05K 7/20772 361/699 |
| 2009/0071625 A1 | 3/2009 | Lyon | |
| 2009/0120622 A1 | 5/2009 | Koch | |
| 2009/0154096 A1 * | 6/2009 | Iyengar | H05K 7/20754 361/694 |
| 2009/0228893 A1 | 9/2009 | Behrendt et al. | |
| 2010/0085708 A1 | 4/2010 | Martin et al. | |
| 2010/0101765 A1 * | 4/2010 | Campbell | H05K 7/20809 165/104.33 |
| 2010/0103620 A1 | 4/2010 | Campbell et al. | |
| 2010/0139887 A1 | 6/2010 | Siessman | |
| 2010/0179695 A1 | 7/2010 | Collins et al. | |
| 2010/0211669 A1 | 8/2010 | Dalgas et al. | |
| 2010/0324962 A1 | 12/2010 | Nesler et al. | |
| 2011/0084839 A1 | 4/2011 | Groth et al. | |

(56) References Cited

U.S. PATENT DOCUMENTS

| | | | |
|---|---|---|---|
| 2011/0100045 A1* | 5/2011 | Carlson | H05K 7/20836 62/259.2 |
| 2011/0100618 A1 | 5/2011 | Carlson | |
| 2011/0127027 A1* | 6/2011 | Kashirajima | F24F 3/065 165/286 |
| 2011/0154842 A1 | 6/2011 | Heydari et al. | |
| 2011/0168379 A1 | 7/2011 | Morgan et al. | |
| 2011/0174001 A1 | 7/2011 | Carlson et al. | |
| 2011/0175498 A1 | 7/2011 | Bash et al. | |
| 2011/0313576 A1 | 12/2011 | Nicewonger | |
| 2012/0103009 A1* | 5/2012 | Ding | F25B 1/00 62/526 |
| 2012/0147553 A1 | 6/2012 | Eriksen | |
| 2012/0273159 A1 | 11/2012 | Eriksen | |

FOREIGN PATENT DOCUMENTS

| | | |
|---|---|---|
| JP | 2007-180505 A | 7/2007 |
| JP | 2007-227902 A | 9/2007 |
| JP | 2007-531991 A | 11/2007 |
| WO | 01/65900 A1 | 9/2001 |
| WO | 03/055055 A1 | 7/2003 |
| WO | 2005/096377 A1 | 10/2005 |

OTHER PUBLICATIONS

Ellsworth, M.J. Jr. et al., "The Evolution of Water Cooling for IBM Large Server Systems: Back to the Future," IEEE, CoolIT Systems Inc. Exhibit 1017, pp. 1-9, (2008).

Schmidt, R.R., "Liquid Cooling is Back," Electronics Cooling Magazine, Published Aug. 1, 2005, Retrieved from the Internet URL: https://www.electronics-cooling.com/2005/08/liquid-cooling-is-back/, on Apr. 30, 2014, pp. 1-7.

Torres, G., "CoolIT Water-Cooling Products," Hardwaresecrets, Published Jan. 14, 2008, Retrieved from the Internet URL:http://www.hardwaresecrets.com/coolit-water-cooling-products/3/, on Dec. 7, 2017, pp. 1-27.

Vertal, L., "Water Cooling Comes of Age, Again," Asetek Data Center Liquid Cooling, Published on Oct. 11, 2013, Retrieved from the Internet URL: https://www.asetek.com/press-room/blog/2013/water-cooling-comes-of-age-again/, on Jan. 4, 2018, pp. 1-4.

Non-Final Office Action dated Apr. 13, 2012, for U.S. Appl. No. 12/169,476, of Lyon, G.S., filed Aug. 11, 2008.

Final Office Action dated Jan. 7, 2013, for U.S. Appl. No. 12/169,476, of Lyon, G.S., filed Aug. 11, 2008.

English-language translation of Technical Opinion for Japanese Registration No. 3179086 (Utility Model Application No. 2012-002117), dated Jan. 10, 2013.

Non-Final Office Action dated Mar. 26, 2015, for U.S. Appl. No. 13/559,340, of Lyon, G.S., et al., filed Jul. 26, 2012.

Final Office Action dated Sep. 8, 2015, for U.S. Appl. No. 13/559,340, of Lyon, G.S., et al., filed Jul. 26, 2012.

Petition for Inter Partes Review of U.S. Pat. No. 8,749,968: United States Patent and Trademark Office, Before the 5 Patent Trial and Appeal Board, *CoolIT Systems, Inc.* v. *Asetek A/S*, Inter Partes Review No. 2014-01172, p. 61, dated Jul. 16, 2014.

Non-Final Office Action dated Jan. 15, 2016, for U.S. Appl. No. 13/559,340, of Lyon, G.S., et al., filed Jul. 26, 2012.

\* cited by examiner

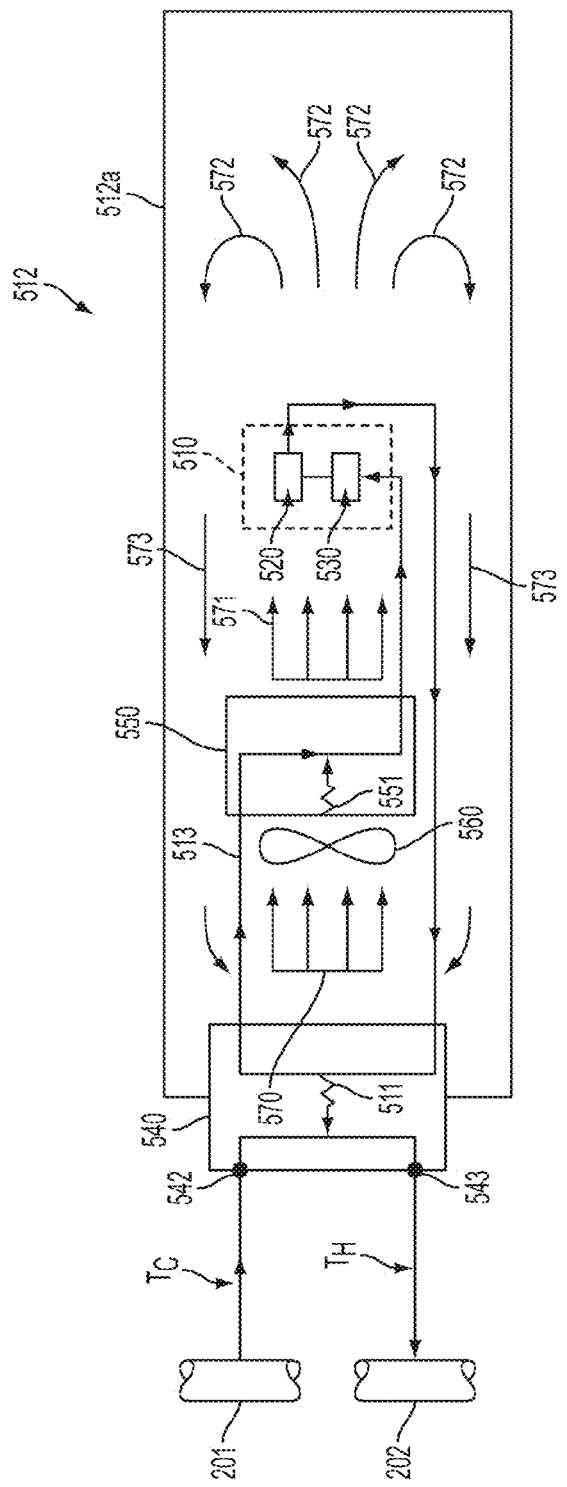
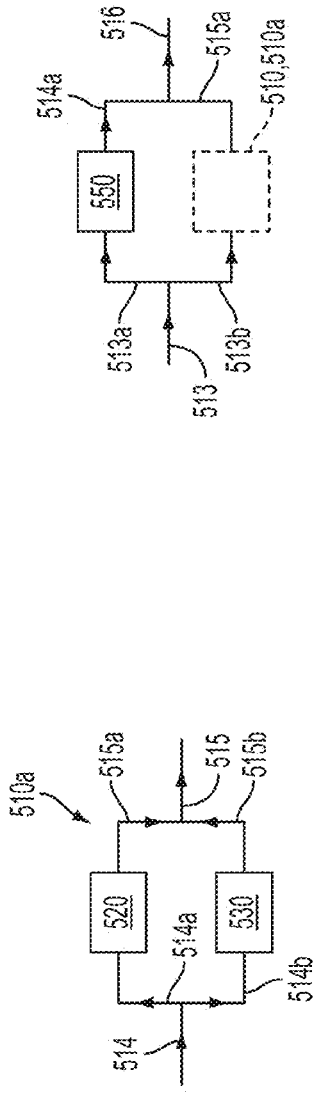
FIG. 14
FIG. 15
FIG. 16

MANIFOLDED HEAT EXCHANGERS AND RELATED SYSTEMS

RELATED APPLICATIONS

This application claims benefit of and priority to U.S. Patent Application No. 61/889,481, filed Oct. 10, 2013, U.S. Patent Application Ser. No. 61/794,698, filed Mar. 15, 2013, U.S. Patent Application No. 61/793,479, filed Mar. 15, 2013, U.S. Patent Application No. 61/805,418, filed Mar. 26, 2013, U.S. Patent Application No. 61/856,566, filed Jul. 19, 2013, and U.S. Patent Application No. 61/880,081, filed Sep. 19, 2013, the contents of which patent applications are hereby incorporated by reference as if recited in full herein for all purposes.

BACKGROUND

The innovations and related subject matter disclosed herein (collectively referred to as the "disclosure") concern systems configured to transfer heat, and more particularly, but not exclusively, to systems having a modular configuration. Some examples of such systems are described in relation to cooling electronic components, though the disclosed innovations may be used in a variety of other heat-transfer applications. Manifolded heat exchangers (sometimes referred to in the art as "heat exchanging manifolds") suitable for such systems are described as examples of but one of several innovative aspects of disclosed systems.

As cloud-based and other services grow, the number of networked computers and computing environments, including servers, has substantially increased and is expected to continue to grow.

Typical commercially-available servers comprise one or more printed circuit boards having a plurality of operable, heat dissipating devices (e.g., integrated electronic components, such as, for example, memory, chipsets, microprocessors, hard drives, etc.). As used herein, the term "heat dissipater" refers to any device or component that dissipates waste heat during operation. Such printed circuit boards are commonly housed in an enclosure. Some enclosures have vents configured to direct external air, e.g., from the data center, into, through and out of the enclosure. Such air can absorb heat dissipated by the operable components. After exhausting from the enclosure, the heated air usually mixes with air in the data center and an air conditioner cools the heated data center air, consuming large amounts of energy in the process. Other servers are sealed, or otherwise significantly inhibit introduction of air from outside the server into the server.

Some relatively higher performance server components dissipate correspondingly more power. Accordingly, many heat exchangers for removing heat dissipated by such components have been proposed. As but one example, modular device-to-liquid heat exchangers have been proposed, as in U.S. patent application Ser. No. 12/189,476, and related applications.

Some data centers provide conditioned heat transfer media to racks and/or servers therein. For example, some data centers provide relatively lower-temperature air, water, or other working fluid suitable for use in absorbing and removing waste heat from a computing environment, computing installation, or computing facility.

Some proposed systems for transferring heat from heat dissipaters (e.g., within a server) to an environment have been expensive and/or difficult to implement. For example, some systems have been configured to circulate facility water into each server within a rack. However, as cooling system demands evolve over time, some future servers might be incompatible with water connections provided by some facilities, possibly limiting adoption of new generations of servers. Other deficiencies of proposed systems include increased part counts and assembly costs.

Therefore, there exists a need for effective and low-cost cooling systems for cooling electronic components, such as, for example, an array of rack mounted servers within a data center, or several arrays of servers within one or among several data centers. There also remains a need for heat-transfer systems associated with computing installations or computing facilities to be compatible with commercially available heat exchangers (e.g., modular device-to-liquid heat exchangers) suitable for use with computing environments, such as, for example, servers. A need remains for facility systems configured to remove heat from one or more servers within a given array of servers. In particular, but not exclusively, there remains a need for reliable cooling systems configured to transfer heat from one or more arrays of servers to a facility heat-transfer medium. A need also remains for such cooling systems to be modular. Such systems should be easy to assemble.

SUMMARY

Some innovations disclosed herein overcome problems in the prior art and address one or more of the aforementioned or other needs, and pertain generally to modular heat-transfer systems suitable for use in removing waste heat from a computing environment, computing installation, and/or computing facility. More particularly, but not exclusively, some innovations pertain to modular components capable of being assembled into such systems. For example, some disclosed innovations pertain to manifolded heat exchangers configured to thermally couple a facility-provided heat-transfer medium with one or more heat exchange elements in one or more corresponding arrays of servers. Other innovations pertain to modular heat-transfer systems incorporating such manifolded heat exchangers. Still other disclosed innovations pertain to methods of and apparatus configured to facilitate exchanging heat between a first heat-transfer medium and a second heat-transfer medium. And, still other disclosed innovations pertain to cooling systems for data centers or other computing installations and computing facilities. In a general sense, some disclosed innovations relate to module and system configurations that eliminate one or more components from conventional systems while retaining one or more of each eliminated component's respective functions.

In some respects, a manifolded heat exchanger can have a heat exchange chamber having a plurality of inlets configured to receive a working fluid of a first fluid circuit and a plurality of outlets configured to discharge the working fluid of the first fluid circuit. An inlet manifold can be configured to receive a working fluid of a second fluid circuit. The inlet manifold can be fluidly isolated from the heat exchange chamber. A plurality of heat transfer channels can extend through the heat exchange chamber and fluidly couple to the inlet manifold. With such an arrangement, the working fluid from the second fluid circuit and the working fluid from the first fluid circuit can be thermally coupled with each other. An outlet manifold can fluidly couple to the plurality of heat transfer channels such that the outlet manifold is configured to discharge the working fluid of the second fluid circuit.

The inlet manifold can be configured to divide an incoming flow of the working fluid of the second fluid circuit into first and second flow paths having opposed bulk flow directions. The heat exchange chamber can be a first heat exchange chamber, and the heat exchanging manifold can have a second heat exchange chamber having a corresponding second plurality of inlets configured to receive a working fluid of a first fluid circuit. A plurality of outlets from the second heat exchange chamber can be configured to discharge the working fluid of the first fluid circuit. The second heat exchange chamber can be positioned opposite the first heat exchange chamber relative to the inlet manifold.

The plurality of heat transfer channels extending through the first heat exchange chamber can be a first plurality of heat transfer channels. The heat exchanging manifold can also have a second plurality of heat transfer channels extending through the second heat exchange chamber and fluidly coupled to the inlet manifold.

Cooling systems for a computing environment are also disclosed. A plurality of heat exchange elements can be configured to facilitate heat transfer from a heat dissipater to a working fluid of a first fluid circuit. Each heat exchange element can have a corresponding inlet and a corresponding outlet. Each heat exchange element can be fluidly coupled to a manifolded heat exchanger as described herein. Working fluid from a second fluid circuit can pass through the manifolded heat exchanger and absorb heat rejected from the working fluid of the first fluid circuit to cool the working fluid of the first fluid circuit. Some cooling systems have a conditioner configured to reject heat from the working fluid of the second fluid circuit to an environment.

Other innovative aspects of this disclosure will become readily apparent to those having ordinary skill in the art from a careful review of the following detailed description (and accompanying drawings), wherein various embodiments of disclosed innovations are shown and described by way of illustration. As will be realized, other and different embodiments of modules and systems incorporating the disclosed innovations are possible, and several disclosed details are capable of being modified in various respects, all without departing from the spirit and scope of the principles disclosed herein. For example, the detailed description set forth below in connection with the appended drawings is intended to describe various embodiments of the disclosed innovations by way of example and is not intended to represent the only embodiments contemplated by the inventors. Instead, the detailed description includes specific details for the purpose of providing a comprehensive understanding of the principles disclosed herein. Accordingly the drawings and detailed description are to be regarded as illustrative and not as restrictive in nature.

BRIEF DESCRIPTION OF THE DRAWINGS

Unless specified otherwise, the accompanying drawings illustrate aspects of the innovative subject matter described herein. Referring to the drawings, wherein like numerals refer to like parts throughout the several views and this specification, several embodiments of presently disclosed principles are illustrated by way of example, and not by way of limitation, wherein:

FIG. 14 shows a schematic illustration of an independently operable server within a sealed enclosure.

FIG. 15 shows a schematic illustration of an alternative configuration of a heat-transfer element suitable for use in connection with the independently operable server illustrated in FIG. 13.

FIG. 16 shows a schematic illustration of an alternative configuration of several heat-transfer modules shown in FIG. 13.

DETAILED DESCRIPTION

The following describes various innovative principles related to modular heat-transfer systems by way of reference to specific examples of modular heat-transfer systems, and more particularly but not exclusively, to modular heat-transfer systems configured to cool one or more computing environments with a computing installation, or one or more computing installations within a computing facility. Nonetheless, one or more of the disclosed principles can be incorporated in various other system configurations to achieve any of a variety of corresponding system characteristics. Systems described in relation to particular configurations, applications, or uses, are merely examples of systems incorporating one or more of the innovative principles disclosed herein and are used to illustrate one or more innovative aspects of the disclosed principles.

Thus, heat-transfer systems having attributes that are different from those specific examples discussed herein can embody one or more of the innovative principles, and can be used in applications not described herein in detail, for example, to transfer heat to or from one or more laser components, light-emitting diodes, chemical reactants undergoing a chemical reaction, photovoltaic cells, solar collectors, power electronic components, electronic components other than microprocessors, photonic integrated circuits, and other electronic modules, as well as a variety of other industrial, military and consumer devices now known or hereafter developed. Accordingly, such alternative embodiments also fall within the scope of this disclosure.

Overview

Following is a description of certain aspects of modular heat-transfer systems configured to transport heat between an array of heat-transfer elements and an environmental heat-transfer coupler, or a conditioner. Some disclosed modular heat-transfer systems are configured to cool a plurality n independently operable servers (or components thereof). Other modular heat-transfer systems incorporating disclosed principles can be configured, for example, to heat a solution of chemical reactants undergoing an endothermic chemical reaction.

EXAMPLE 1

Server Cooling System

Figure 1:
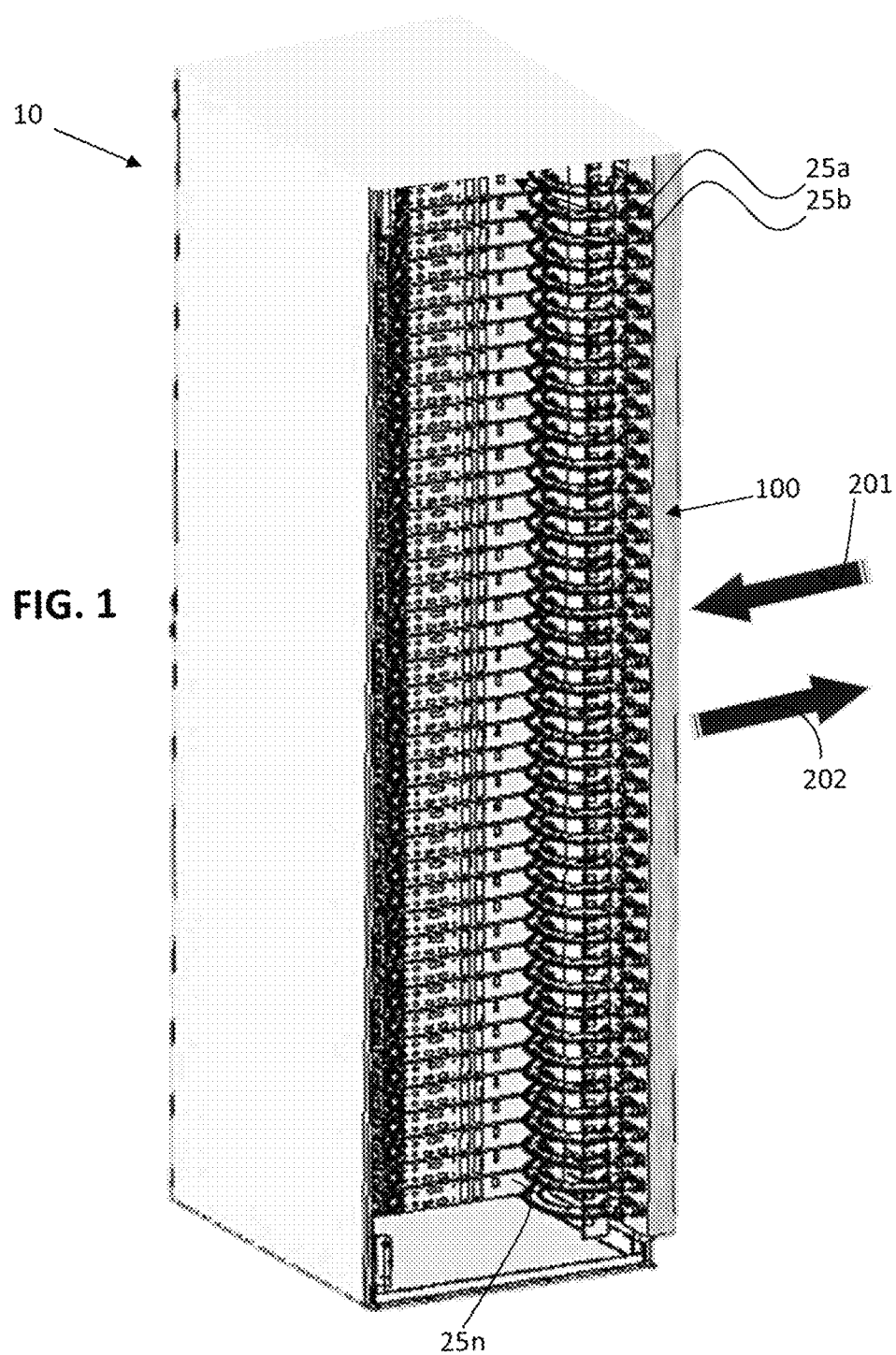
FIG. 1 shows an isometric view of one particular example of many possible embodiments of a computing installation.

In connection with one example of many possible examples of disclosed heat-transfer systems, FIG. 1 shows a computing installation 10 having a plurality of n rack-mounted servers 25a, 25b . . . 25n (hereafter referred to as 25a-n) cooled by a cooling system of the type disclosed herein. The cooling system is configured to cool one or more heat dissipaters in an array of independent servers 25a-n.

Figure 3:
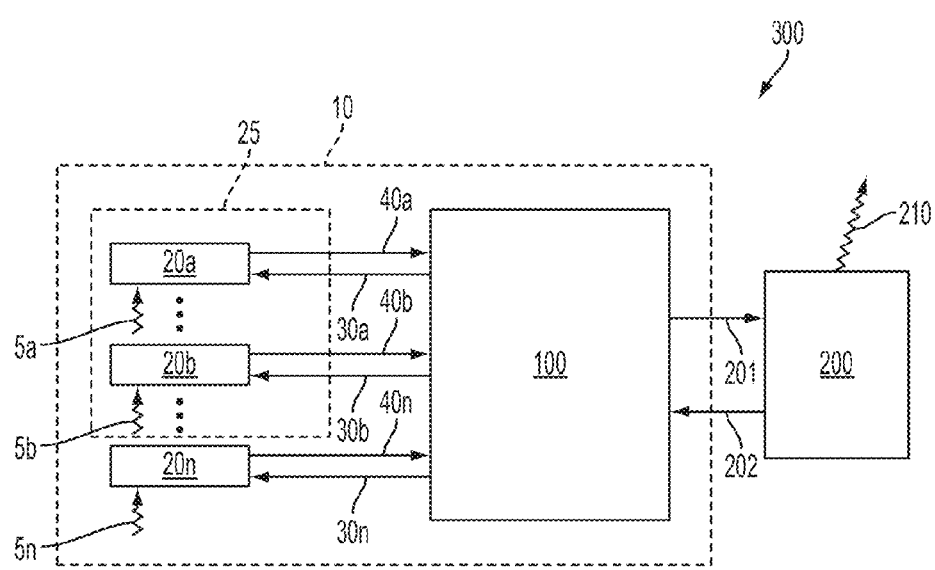
FIG. 3 shows a schematic illustration of a generalized arrangement of a computing installation.
Figure 3A:
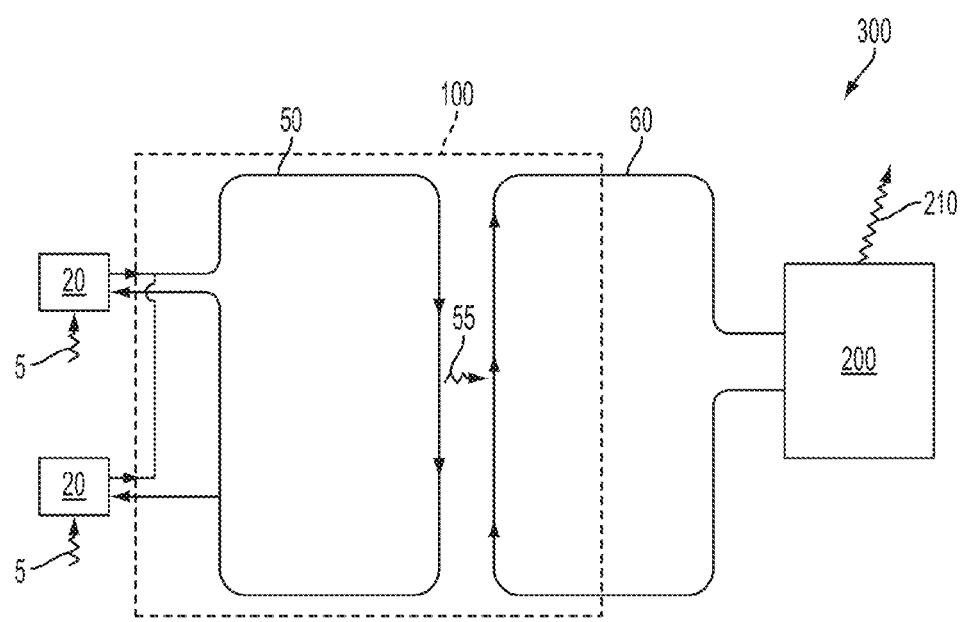
FIG. 3A shows a schematic illustration of thermally coupled first and second fluid circuits.

In a system as depicted in FIG. 1, waste heat from the plurality of servers 25a-n is absorbed by a first working fluid in a first fluid circuit 50 (FIG. 3A), carried with the first working fluid from the respective plurality of servers 25a-n to a manifolded heat exchanger 100 (sometimes also referred to as a "manifold module"), and rejected to a second, relatively cooler working fluid in a second fluid circuit 60 (FIG. 3A). The arrows 201 and 202 depict, respectively, an incoming flow path (arrow 201) of relatively cool second working fluid into, and an outgoing flow path (arrow 202) of the second working fluid carrying the waste heat away from, the manifolded heat exchanger 100.

Figure 2:
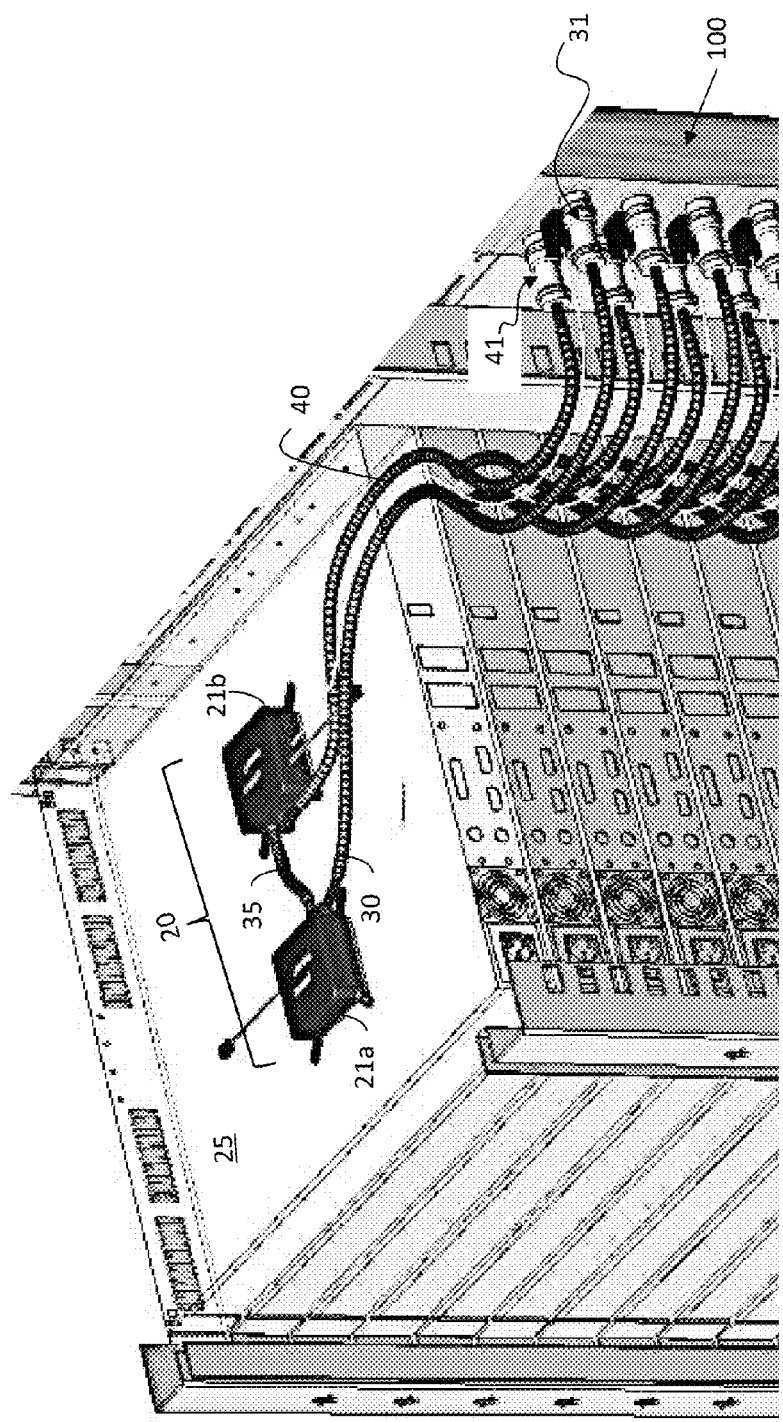
FIG. 2 shows an isometric view of a portion of one particular example of many possible embodiments of a computing environment within the computing installation shown in FIG. 1.
Figure 2A:
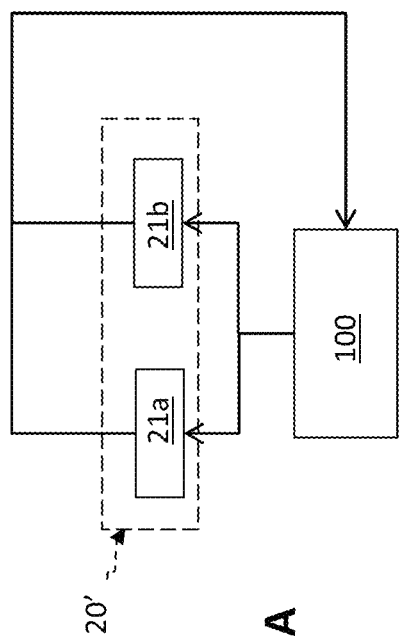
FIG. 2A shows a schematic illustration of an alternative arrangement of a heat-transfer module.

As shown in FIGS. 2 and 2A by way of example, one or more heat-transfer elements 20 (or 20') in the cooling system can correspond to each server 25a-n. Thus, as shown in FIG. 3, the cooling system can include a plurality of heat-transfer elements 20 (or 20') forming an array having n heat-transfer elements 20a-n. In turn, each in the array of heat-transfer elements 20a-n can be thermally coupled to a respective one or more heat dissipaters in each respective server 25a-n as FIG. 3 indicates.

Referring to FIGS. 1 and 2, a manifold module 100 can be configured to distribute a relatively cooler working fluid, or coolant, among the plurality of heat-transfer elements 20a-n, allowing the coolant to absorb heat from the heat dissipaters in the servers 25a-n to cool them. The manifold 100 can also collect the heated working fluid from each heat-transfer element 20a-n in the array of heat-transfer elements. As indicated by the wavy arrow 55 (FIG. 3A), the heat-exchanging manifold 100 can be further configured to transfer heat between a heat-transfer medium, or working fluid, in the second fluid circuit 60 and the working fluid in the first fluid circuit 50 heated by the heat-transfer elements 20a-n in the array of servers 25a-n.

Figure 12:
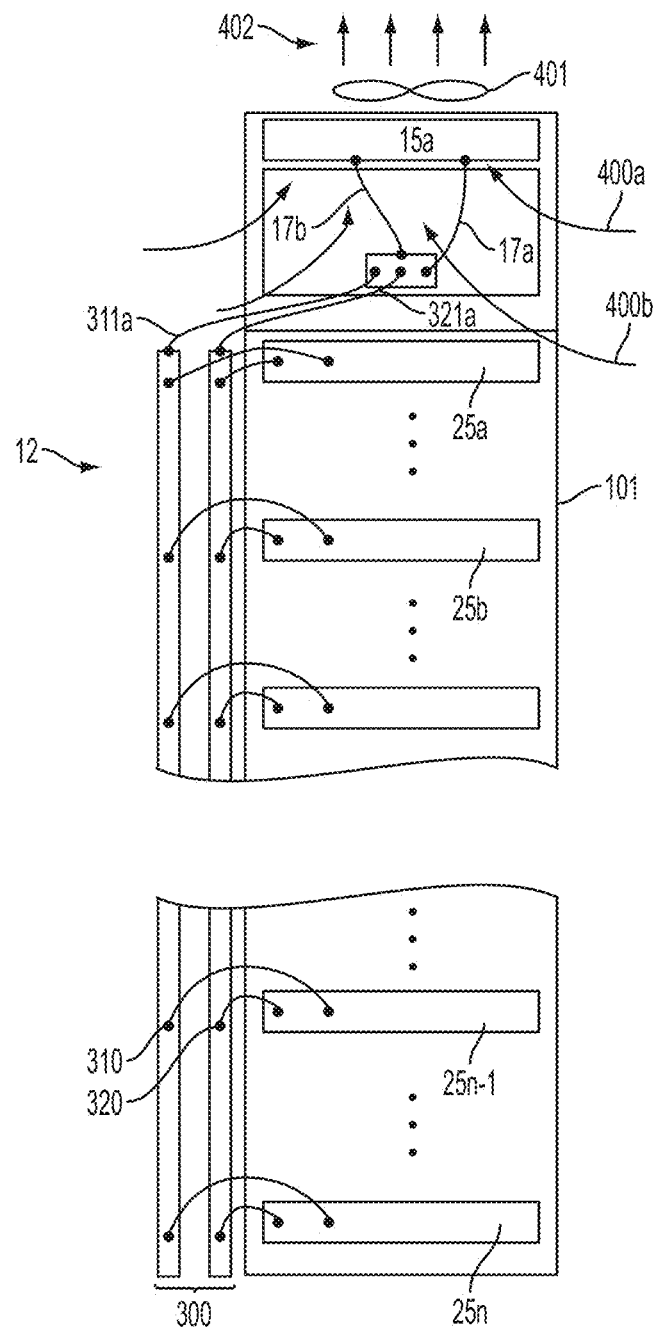
FIG. 12 shows a schematic illustration of a computing installation similar to the embodiment shown in FIG. 1.
Figure 13:
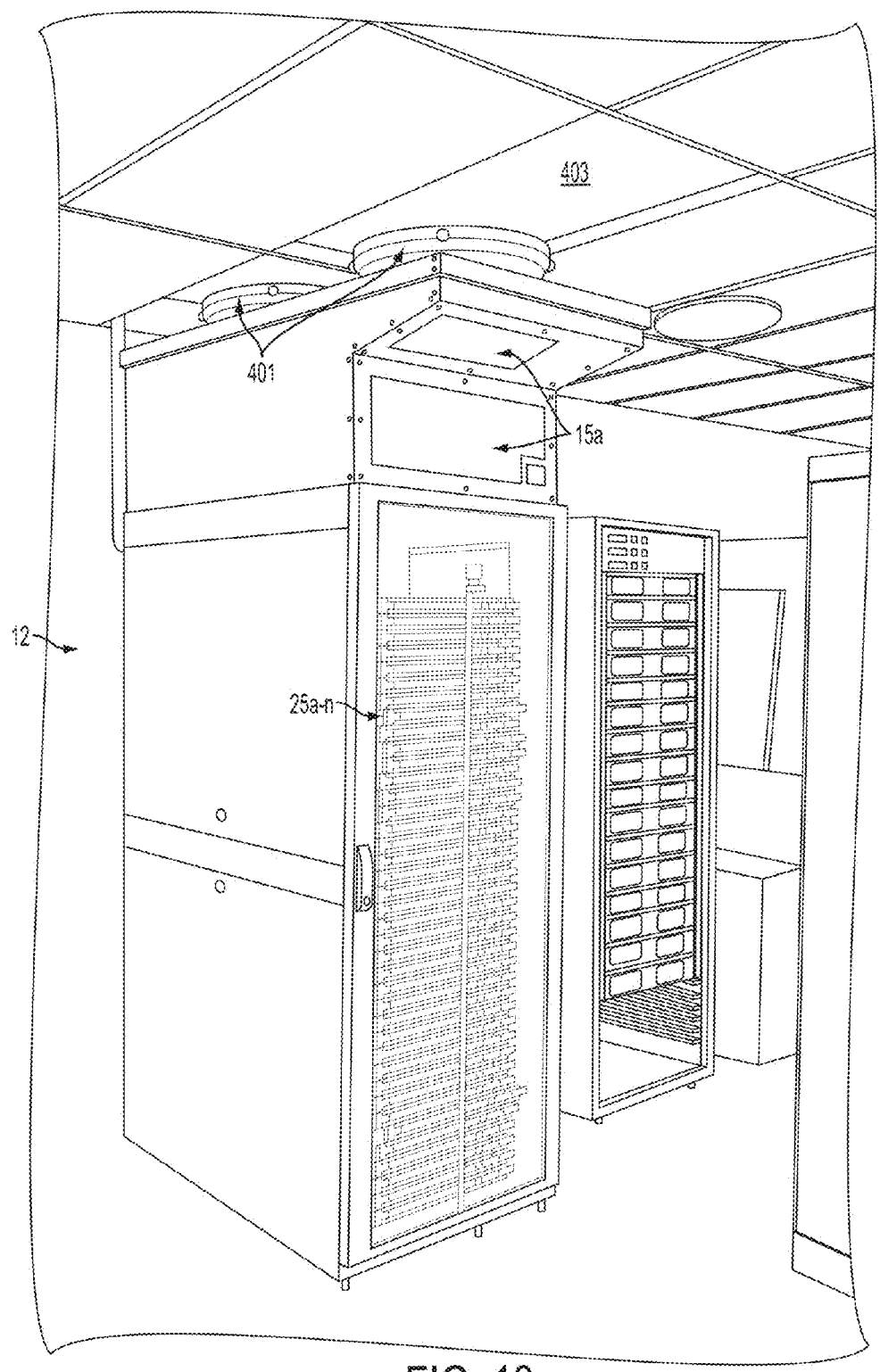
FIG. 13 shows a line drawing of a photograph of a working embodiment of a computing installation of the type shown in FIG. 11.
Figure 17:
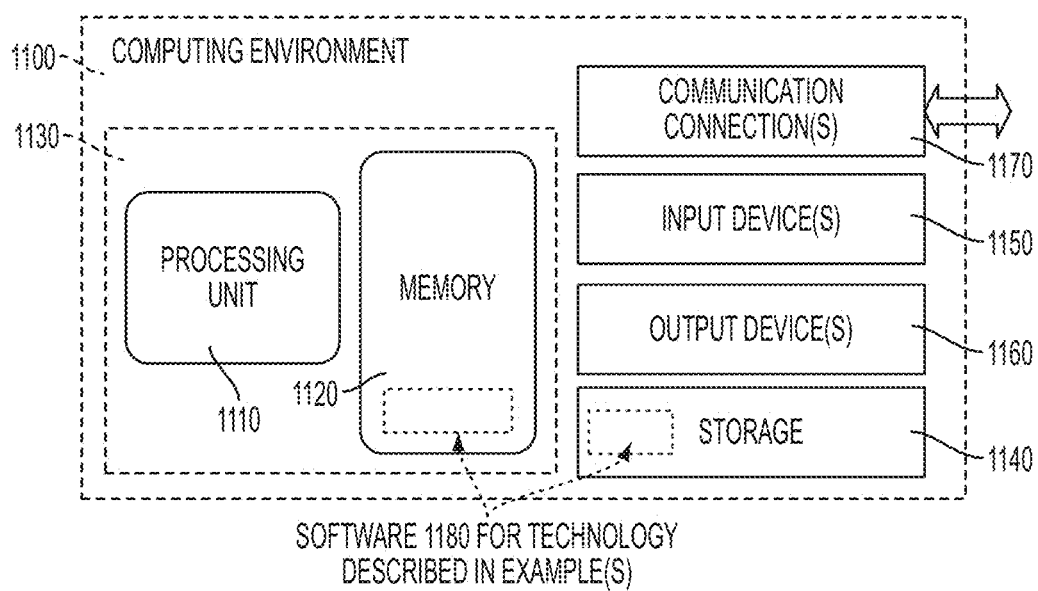
FIG. 17 shows a block diagram of a computing environment of the type incorporated in a computing installation as shown in FIG. 3.

In certain embodiments, the heat transfer medium in the second fluid circuit 60 can be air or another selected gas. An embodiment of an air-cooled heat exchanger is shown in FIGS. 12 and 13, and is described more fully below in connection therewith. In other instances, the working fluid in the second fluid circuit can include a facility water or other liquid coolant. In either case, the working fluid in the second fluid circuit can, but need not, be cooled to a temperature less than an outside ambient temperature. In particular, cooling arrangements disclosed herein can provide substantial performance improvements over conventional and alternative arrangements at substantially reduced cost. The heat-transfer medium in the second fluid circuit 60 can pass through a conditioner 200 configured to reject heat 210 from the heat-transfer medium in the second fluid circuit to an environment 300, e.g., facility water, facility air, ambient water, ambient air, etc. (FIG. 3). As explained more fully below, the conditioner 200 can include a liquid-to-liquid heat exchanger, a liquid-to-air heat exchanger, or both.

EXAMPLE 2

Generalized Computing Installation No. 1

As used herein, the term "server" generally refers to a computing device or, more generally, a computing environment, connected to a computing network and running software configured to receive requests (e.g., a request to access or to store a file, a request to provide computing resources, a request to connect to another client) from client computers also connected to the computing network. In some instances, an array having one or more than one server can be arranged (e.g., physically mounted) in a "chassis" (or a "rack"), regardless of whether any sever in the array is operatively coupled to any other server in the array (e.g., over a network or other communication connection). Such an array of computing elements is sometimes referred to as a "computing installation." An array having one or more than one computing installation is sometimes referred to as a "computing facility."

The term "data center" (also sometimes referred to in the art as a "server farm") loosely refers to a physical location housing one or more server racks. In some instances, a data center can simply comprise an unobtrusive corner in a small office. In other instances, a data center can comprise several large, warehouse-sized buildings enclosing tens of thousands of square feet and housing thousands of servers. Depending on its scale and arrangement of servers within, a data center can constitute a computing installation or a computing facility.

Referring to FIG. 3, a computing installation 10 (e.g., a rack having an array of independently operable servers 25a-n, one or more multi-processor computing environments, a server room housing a plurality of racks each having one or more independently operable servers) can have a plurality of components, and each in the plurality of components in the computing installation 10 can dissipate waste heat during operation. The dissipated waste heat from a given heat dissipater (e.g., a micro-processor, CPU, GPU, chipset, memory device, a server or other computing environment, or rack having one or more independently operable servers) is depicted in FIG. 3 as a wavy arrow 5a, 5b, . . . 5n. A heat exchange element 20a, 20b, . . . 20n, can be thermally coupled to a corresponding one or more of the heat dissipaters. As the particular examples shown in FIGS. 2 and 2A show, a plurality of heat exchangers 20a, 20b can be fluidly coupled to each other to form a heat-transfer element 20. In FIG. 2, the heat exchangers 21a, 21b are fluidly coupled to each other in series. In FIG. 2A, the heat exchangers 21a, 21b are fluidly coupled to each other in parallel.

As shown in FIG. 3, a given computing environment 25 can have one or more heat dissipaters, each being coupled to a corresponding heat exchanger 21. As but one example, a given computing environment 25 can be configured as a 1U server, and can include one or more processors that dissipate heat during operation (e.g., can include one, two, four, eight, or another number of microprocessors). Alternatively, the computing environment 25 can include a rack housing a plurality of independently operable servers 11 (FIG. 1). The computing installation 10 can have one or more other heat dissipaters apart from the computing environment 25, as indicated by the waste heat 5n and the heat exchanger 20n.

Each heat exchange element 20a, 20b . . . 20n, can be fluidly coupled to a manifolded heat exchanger 100, forming a portion of a first fluid circuit 50, as shown in FIG. 3A. As indicated by the fluid couplers 40a, 40b . . . 40n, a fluid coupler can fluidly couple an outlet from each respective heat exchange element 20a, 20b . . . 20n to an inlet to the manifold heat exchanger 100. Similarly, a fluid coupler 30a, 30b . . . 30n can fluidly couple an inlet to each respective heat exchange element 20a, 20b . . . 20n to an outlet from the manifolded heat exchanger 100. The heat exchange elements 20a, 20b . . . 20n, fluid couplers 30a, 30b . . . 30n, fluid couplers 40a, 40b . . . 40c, and a portion of the manifolded heat exchanger 100 can define a first fluid circuit 50. The first fluid circuit 50 can comprise one or more pumps to circulate a working fluid, or coolant, among the heat exchange elements and the manifold 100, carrying waste heat 5 from the heat dissipaters to the manifolded heat exchanger 100.

In some embodiments, one or more heat exchange elements 20a-n include a pump configured to urge a flow of coolant therethrough. In some embodiments, one or more heat exchangers 21 in each heat exchange element 20 includes a pump. In other embodiments, the first fluid circuit 50 can include a pump fluidly coupled with, but spaced from, a heat exchanger 21 or a heat exchange element 20.

Another portion of the manifolded heat exchanger 100 can be fluidly coupled to the second fluid circuit 60 (FIG. 3A). One of many possible examples of such a second fluid circuit 60 is shown schematically in FIG. 3. A medium coupler 202 can fluidly couple an outlet from the manifolded heat exchanger 100 to an inlet to a conditioner 200. The conditioner 200 can be configured to reject heat 210 to an environment 300. A medium coupler 201 can fluidly couple an outlet from the conditioner 200 to an inlet to the manifolded heat exchanger 100. The second fluid circuit 60 can convey a heat transfer medium (e.g., another coolant, or working fluid) therethrough.

The heat-transfer medium entering the manifolded heat exchanger 100 from the conditioner 200 can be relatively cooler than the working fluid entering the manifolded heat exchanger 10 from the heat exchangers 20a, 20b . . . 20n. A heat exchanger portion 112, 112' (FIG. 4) of the manifolded heat exchanger can be configured to facilitate efficient heat exchange 55 between the working fluid in the first fluid circuit 50 and the working fluid in the second fluid circuit 60. When applied to a cooling system as shown in FIG. 3, the manifolded heat exchanger 100 can be configured to cool the working fluid in the first fluid circuit 50 by rejecting heat absorbed by the working fluid in the circuit 50 to the working fluid in the second fluid circuit 60. The cooled working fluid in the first fluid circuit 50 can return to the heat exchange elements 20a, 20b . . . 20n, e.g., to cool the corresponding heat dissipaters.

EXAMPLE 3

Air Heat Exchange Module

In some embodiments, the conditioner 200 constitutes a liquid-to-air heat exchanger (sometimes referred to in the art as a "radiator" or an "air heat exchange module").

Figure 11:
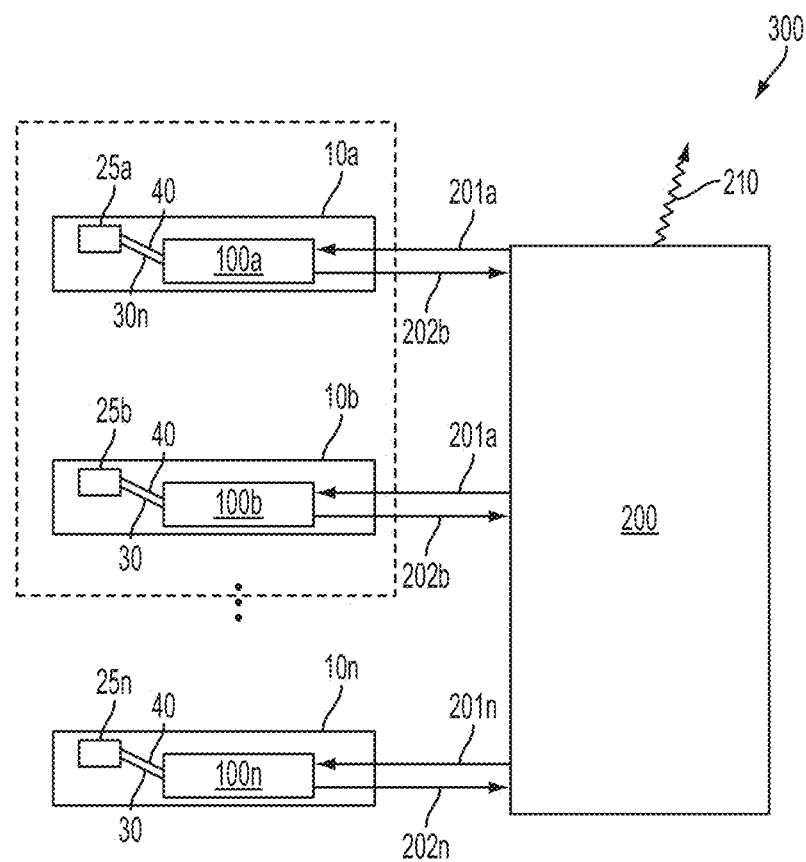
FIG. 11 shows a schematic illustration of a generalized arrangement of a computing facility having a plurality of computing installations shown in FIG. 3.

For example, in the schematic illustration of a rack of servers 12 shown in FIG. 11, a manifold module 300 is fluidicly coupled to a reservoir 315 (e.g., configured to relieve fluid pressure within the working fluid). In the example illustrated, a distribution manifold 310 is configured to receive cooled working fluid from a portion of the reservoir 315 and a collection manifold 320 is configured to deliver heated working fluid to a portion of the reservoir. A first fluid conduit 17a fluidicly couples a first outlet from the reservoir 315 to a corresponding inlet to a radiator 15a. A second fluid conduit 17b fluidicly couples an outlet from the radiator 15a to a corresponding inlet to the reservoir. The corresponding inlet to the reservoir is fluidicly coupled to an outlet from the reservoir, which in turn is fluidicly coupled to the distribution manifold 310 by a conduit 311a. In the illustrated example, a working fluid in the first portion of the reservoir and in the second portion of the reservoir are not permitted to mix with each other (as by the reservoir configuration), though other reservoir embodiments are configured to allow them to mix with each other.

In other embodiments, the reservoir 315 is configured to receive working fluid from only the collection manifold 320 or to deliver working fluid only to the distribution manifold 310. For example, in some embodiments, a conduit fluidicly couples the collection manifold 320 to an inlet to the reservoir, and another conduit fluidicly couples the outlet from the reservoir to an inlet to the environmental coupler (e.g., a liquid-to-air heat exchanger 15a). In such an embodiment, a conduit can extend between and fluidicly couple an outlet from the environmental coupler and an inlet to the distribution manifold 210, bypassing the reservoir.

As indicated in FIG. 12, a radiator 15a can be configured as a cross-flow radiator. As an example, one or more air movers 401 can be configured to deliver a stream of relatively cool air 400a, 400b across a heat-transfer surface of a radiator 15a, transferring heat from the working fluid passing through the radiator to the air stream, heating the stream of air and cooling the working fluid. The relatively warmer stream of air 402 can be exhausted to a selected region.

In the case of some data centers, the relatively warmer stream of air 402 can be exhausted into a collection plenum or other air handler associated with the data center. The air handler can direct the heated stream of air 402 through another heat-transfer circuit which cools the heated air (as by rejecting heat from the air to an environment).

In other embodiments, the manifolded heat exchanger shown in FIGS. 3 and 3A can be arranged as a liquid-to-air heat exchanger. Such an arrangement can omit an independent reservoir and separate conduits 311a, 321a (e.g., as medium couplers 201, 202). An air handler directing air to the air-cooled heat exchanger can constitute a medium coupler 201 in FIG. 3 and an air handler carrying heat from the air-cooled heat exchanger can constitute a medium coupler 202. A heat pump, cooling tower, a Joule-Thompson cooler, or other air conditioner can constitute a conditioner 200.

FIG. 12 illustrates a working embodiment of a rack of servers cooled with a modular heat transfer system of the type described herein. A radiator 15a rejects heat from the working fluid to a stream of relatively cooler air 400a, 400b.

A pair of fans 401 directs the airstream through the radiator 15a and the heated air 402 is directed into ductwork 403 of a facility HVAC system. A high-efficiency axial fan located above the radiator can deliver about 3500 cubic feet of air per minute (cfm) through the radiator 15a. As shown, a duct (sometimes referred to in the art as a "chimney") can rest atop the rack to direct air from a server room, through the radiator 15a and into an existing facility HVAC system. The HVAC system can cool the air and return the cooled air to the server room for further cooling of the air heat exchanger 15a and working fluid therein. In FIG. 12, the server modules 112 are configured as 1U servers.

Example 4

Manifolded Heat Exchanger

Figure 4:
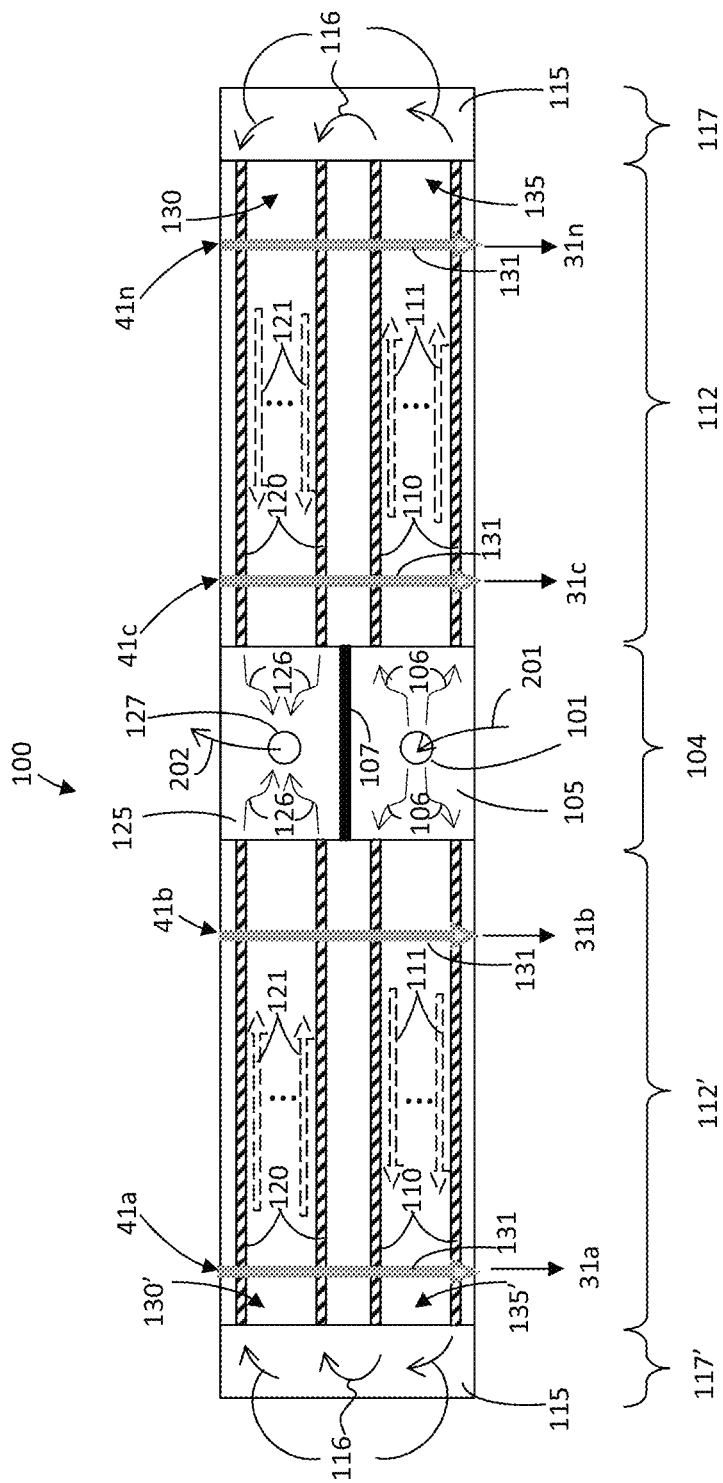
FIG. 4 shows a schematic illustration of a manifolded heat exchanger.

An example of a manifolded heat exchanger 100 is shown schematically in FIG. 4. As indicated above, a first portion of the manifolded heat exchanger can define a portion of the first fluid circuit 50 and a second portion of the manifolded heat exchanger 100 can define a portion of the second fluid circuit 60.

The manifolded heat exchanger 100 shown in FIG. 4 has a generally centrally positioned manifold region (or portion) 104 flanked by opposed, outwardly positioned heat exchanger portions 112, 112'. The heat exchanger portions 112, 112' provide the thermal coupling between the first fluid circuit 50 and the second fluid circuit 60. Outward of each respective heat exchanger portion 112, 112', relative to the manifold region 104, is a corresponding plenum region 117, 117'. As described more fully below, the coolant associated with the second fluid circuit 60 (e.g., relatively cooler coolant, such as, for example, cool facility water) can enter the manifolded heat exchanger 100 in the central region 104 and split into divergent flow paths toward the opposed heat exchanger portions 112, 112'. For example, the coolant associated with the second fluid circuit 60 can flow outwardly from the central region 104 through a plurality of heat transfer channels 110, 110' positioned in the heat exchanger portions 112, 112' and into the distally positioned plenum regions 117, 117'. Each respective plenum region can direct the flow of coolant in the second fluid circuit 60 back through a plurality of heat transfer channels 120, 120' positioned in the outwardly positioned heat exchanger portions 112, 112' and into the central region 104, where the coolant can be exhausted from the manifolded heat exchanger 100, carrying with it heat absorbed by the coolant through the heat exchanger portions 112, 112'.

The illustrated heat exchanger portions 112, 112' can be configured as cross-flow heat exchangers. For example, the coolant associated with the first fluid circuit 50 (e.g., relatively warmer coolant that has absorbed heat from a plurality of heat dissipaters) can flow through the heat exchanger portions 112, 112' in a bulk direction (indicated by arrows 131) transverse to a bulk flow direction (indicated by arrows 111, 121) of the coolant associated with the second fluid circuit 60 as it passes through the heat exchanger portions 112, 112' as just described.

Figure 5:
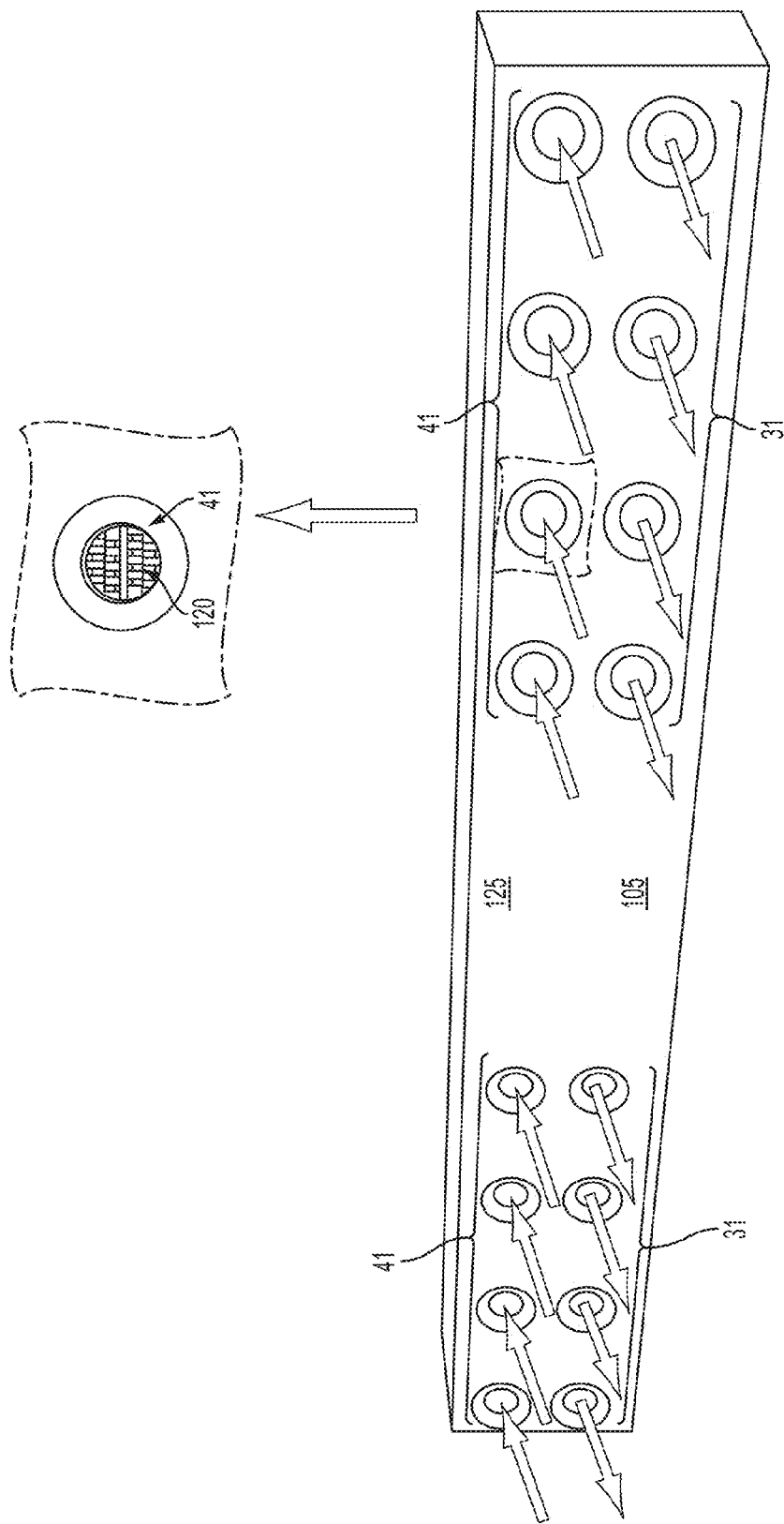
FIG. 5 shows a line drawing reproduction of a photograph of a first side of a working embodiment of a manifolded heat exchanger of the type shown schematically in FIG. 4.
Figure 6:
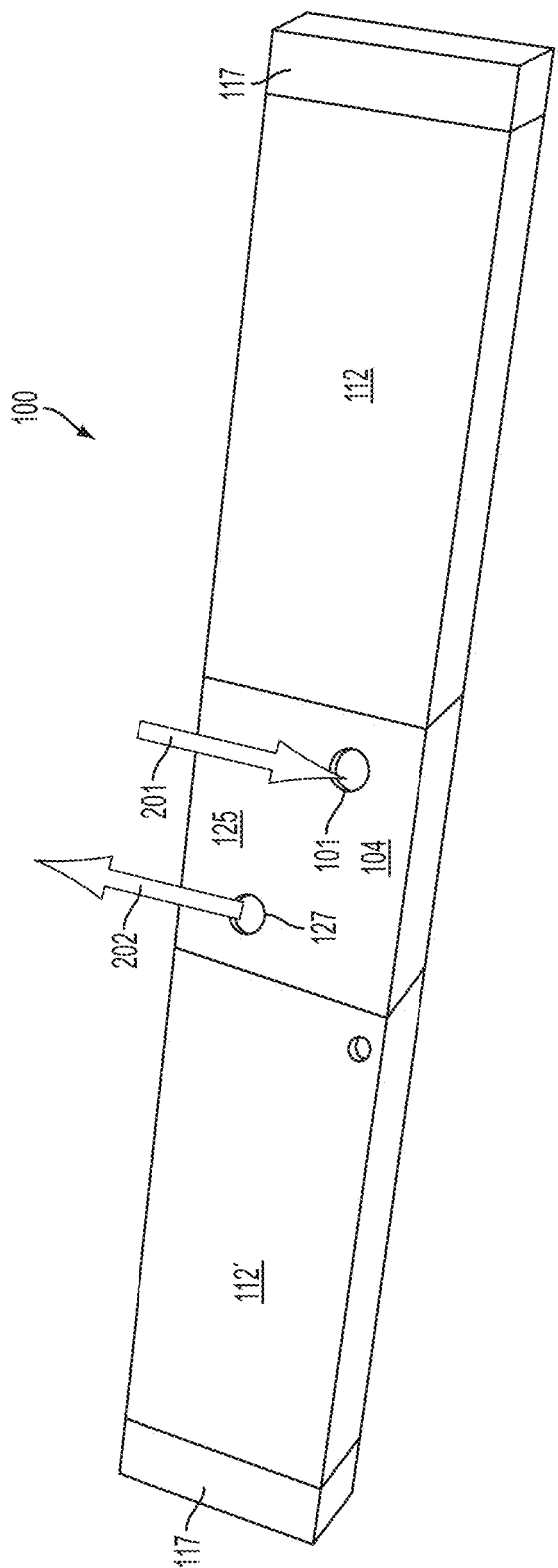
FIG. 6 shows a line drawing reproduction of a photograph of a second side of the working embodiment shown in FIG. 5.

By way of example, the arrows 111, 121 depict a bulk flow direction of the coolant associated with the second fluid circuit 60 through the channels 110, 110', 120, 120' positioned in the heat exchanger portions 112, 112' and the arrows 131 depict a bulk flow direction of the coolant associated with the first fluid circuit 50 through the heat exchanger portions 112, 112'. As the arrows 111, 121 show, the coolant associated with the second fluid circuit 60 can make a first, outwardly directed pass through the heat exchanger portions 112, 112' and a second, inwardly directed pass through the heat exchanger portions. Nonetheless, the coolant in the second fluid circuit 60 can make more or fewer passes through the heat exchanger portions 112, 112'. The coolant associated with the first fluid circuit 50 can make one or more passes through the heat exchanger portions 112, 112', as described more fully below in connection with a working embodiment of a manifolded heat exchanger 100. In any event, the fluid circuits 50 and 60 can be fluidly isolated from and thermally coupled with each other. FIGS. 5 and 6 show aspects of a working embodiment of such a manifolded heat exchanger.

Figure 7:
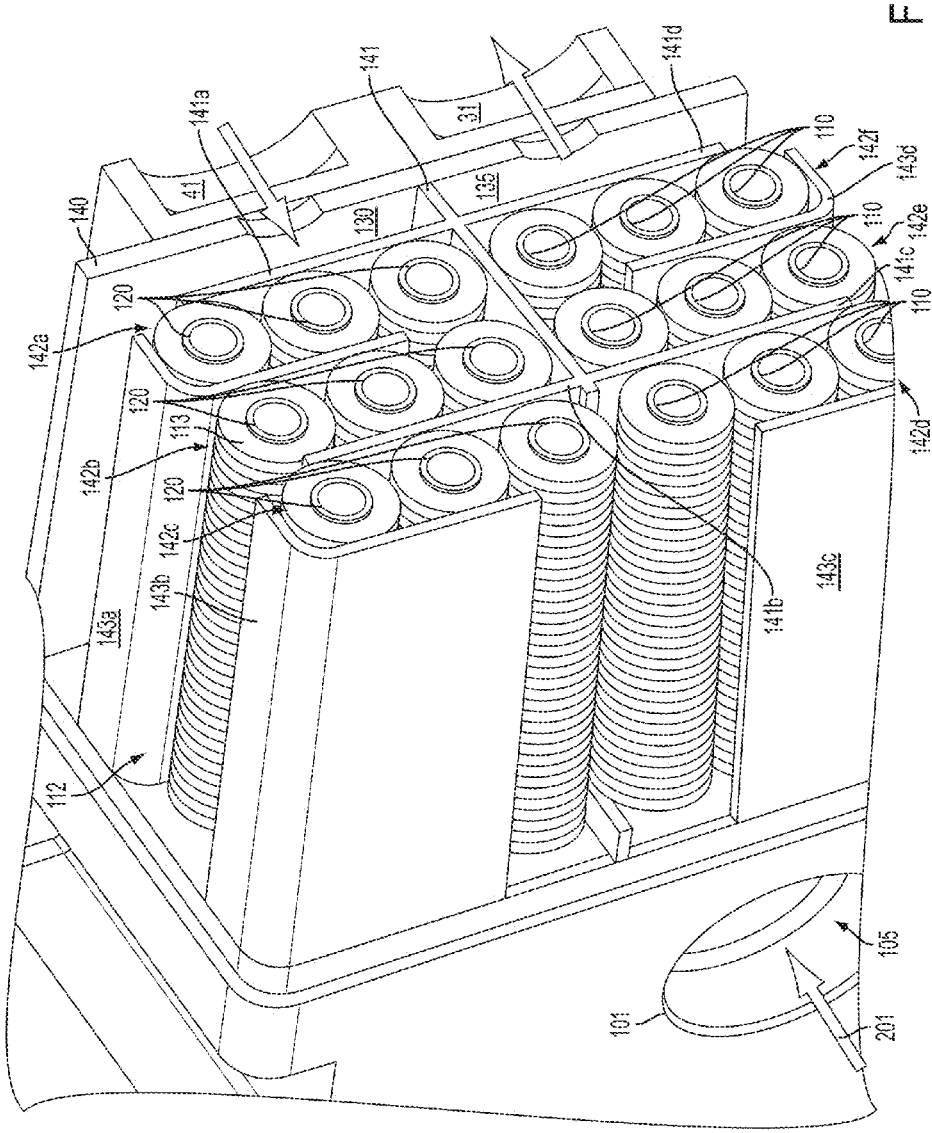
FIGS. 7, 8 and 9 show partially cut-away, isometric views of a portion of the working embodiment shown in FIGS. 5 and 6.

As a further example, shown in FIG. 7, each inlet 41a, 41b, 41c . . . 41n (hereafter referred to as 41a-n) to the manifolded heat exchanger 100 from the first fluid circuit 50 can receive a relatively warmer working fluid from a corresponding heat exchange element 20 (FIG. 2), 20a, 20b . . . 20n (FIG. 3) in the first fluid circuit. The fluid coupling between the manifolded heat exchanger and the heat exchange element 20 can include a quick disconnect coupling, in some instances a blind-mate quick-disconnect coupling.

In some embodiments, the inlets 41a-n are fluidly coupled to a chamber, e.g., chamber 130, 135 or chamber 130', 135', in a heat exchanger portion 112, 112' and allow the relatively warmer working fluid from each heat exchange element 20a-n to mix with working fluid from one or more other heat exchangers 20a-n. As indicated by the arrows 131 (FIG. 4), working fluid entering the inlets 41a-n can pass through the heat exchanger portion 112, 112' of the manifolded heat exchanger 100 and be discharged from a corresponding outlet 31a, 31b, 31c . . . 31n (referred to as 31a-n) of the manifolded heat exchanger 100. As the relatively warmer working fluid passes from the inlets 41a-n to the outlets 31a-n, heat 55 (FIG. 3A) can be transferred from the working fluid in the first fluid circuit 50 to the working fluid in the second fluid circuit 60, cooling the working fluid in the first fluid circuit. For example, relatively warmer working fluid in the first fluid circuit 50 can enter a manifold region 130 (FIG. 7) of the heat exchanger portion 112, 112'. As heat 55 is rejected from the working fluid of the first circuit 50 passing through the heat exchanger portion 112, 112', the temperature of the working fluid can decrease such that relatively cooler working fluid discharges from the exhaust manifold portion 135 of the heat exchanger 112, 112'. The cooled working fluid in the first fluid circuit 50 can exhaust from the manifold 135 through the outlets 31a-n and return to the heat exchange elements 20a-n for cooling the heat dissipaters. The outlets 31a-n can have fluid quick-disconnect couplers.

FIG. 4 also schematically illustrates the flow path through the manifolded heat exchanger 100 taken by working fluid in the second fluid circuit 60. For example, a relatively cooler working fluid (e.g., a conditioned heat transfer medium, such as, for example, cool facility water) can pass through an inlet port 101 opening to an inlet manifold 105, indicated by arrow 201. As indicated by the arrows 106, the inlet manifold 105 can distribute the relatively cooler working fluid among a first plurality of heat-transfer channels 110.

The first plurality of heat transfer channels 110 can have first and second groups of heat transfer channels 110 positioned in respective first and second heat exchanger portions 112, 112' of the manifold module 100. The first and the second groups of heat transfer channels 110 can be positioned opposite each other, with the inlet manifold 105 positioned therebetween, as shown in FIG. 4. For example, the first group of heat transfer channels can be positioned in and extend through the portion 112, and the second group of heat transfer channels 110 can be positioned in and extend through the portion 112'.

As indicated by the arrows 111, the relatively cooler working fluid of the second fluid circuit 60 can flow from the inlet manifold 105 outwardly through the channels 110 and discharge into a corresponding turning plenum 115. As the relatively cooler working fluid passes through the channels 110, it can absorb heat 55 from the working fluid within the first fluid circuit 50.

With such an arrangement as depicted in FIG. 4, an incoming flow 201 of relatively cooler heat transfer medium from the second fluid circuit 60 can be divided (or "split") between the first and the second group of heat transfer channels. Splitting an incoming flow of relatively cooler heat-transfer medium, or coolant, from the second fluid circuit 60 can expose relatively cooler heat-transfer medium to a larger volume (or flow rate) of coolant within the first fluid circuit 50, as compared to a flow path that does not split within the inlet manifold 105. For example, a stream of coolant in the first fluid circuit 50 passing from inlet 41*b* to outlet 31*b* could be exposed to relatively cooler coolant in the second fluid circuit 60 as compared to a stream of coolant passing from the inlet 41*a* to the outlet 31*a*, since a bulk fluid temperature of coolant passing through the heat transfer channels 110 increases as the coolant flows from the inlet manifold 105 to the turning plenum 115. The increase in bulk fluid temperature increases in correspondence with the amount of heat 55 transferred to the coolant in the heat transfer channels 110 from the coolant passing through the heat transfer portions 112, 112'. Such flow splitting improves overall heat exchanger efficiency of the manifolded heat exchanger 100.

The working embodiment of manifolded heat exchanger shown in FIG. 11 does not split an incoming flow.

Working fluid discharged from each heat transfer channel 110 into the turning plenum 115 can mix with discharged working fluid from each of the other channels 110 from the same heat exchanger portion 112, 112'. The turning plenum 115 can distribute the working fluid among a second plurality of heat transfer channels 120. The arrows 121 indicate a direction of flow of the working fluid through the second plurality of heat transfer channels 120. As the working fluid passes through the heat transfer channels 120, it can absorb additional heat 55 from the relatively warmer working fluid entering the heat exchanger portion 112, 112' from the first fluid circuit 50.

The channels 120 can discharge the working fluid of the second fluid circuit 60 into an outlet manifold 125. From the outlet manifold 125, the working fluid can discharge through an outlet port 127, indicated by arrows 126. As described above, the working fluid discharged from the outlet manifold 125 can be conveyed to a conditioner 200, where heat 55 absorbed by the working fluid in the second fluid circuit 60 can be rejected as heat 210 to an environment 300.

An arrangement of a manifolded heat exchanger as shown in FIG. 4 provides efficient heat transfer between the coolants in the first and the second fluid circuits 50, 60 insofar as it maintains a relatively large temperature difference between the coolants throughout the manifolded heat exchanger. For example, relatively cooler heat transfer medium from the second fluid circuit 60 passes through the heat transfer channels 110 and is exposed to coolant from the first fluid circuit 50 in the heat exchanger portion 112, 112', which coolant has already rejected a portion of the waste heat 55 to coolant in the channels 120.

Similarly, the coolant passing through the channels 120 will have absorbed heat as it passed through the channels 110, and thus has a relatively higher bulk temperature than the coolant passing through the channels 110. Nonetheless, the coolant in the channels 120 can still be relatively cooler than coolant from the first circuit 50 entering the inlet ports 41*a-n*, since the incoming coolant from the first circuit 50 has rejected little if no heat absorbed from the heat dissipaters. This is shown schematically in FIG. 3A with the counter flow arrangement of the first and the second fluid circuits 50, 60.

EXAMPLE 5

First Working Embodiment

FIGS. 5, 6, 7, 7A, 8 and 9 show a first working embodiment of a manifolded heat exchanger 100. FIG. 5 shows a first side of the working embodiment. As shown in FIG. 5, a manifolded heat exchanger 100 can have an elongate body and a substantially planar first face defining a plurality of apertures 31, 41. The plurality of apertures 31, 41 can define respective inlets 41*a-n* and respective outlets 31*a-n* as described above in relation to FIG. 4. As with the schematically illustrated manifolded heat exchanger shown in FIG. 4, the manifolded heat exchanger 100 shown in FIG. 5 has heat-exchanger portions 112, 112' positioned laterally outward of a manifold region 105, 125.

A second side (in opposed relation to the first side) of the working embodiment shown in FIG. 5 is shown in FIG. 6. The second side defines an inlet port 101 and an outlet port 127. Coolant from the second fluid circuit 60 can enter the heat exchanging manifold 100 through the inlet port 101 and flow into the inlet manifold 105 (FIG. 5), as indicated by the arrow 201. As described in relation to the schematic illustration of the heat exchanging manifold 100 shown in FIG. 4, the inlet manifold 105 can distribute the coolant among a first group of heat transfer channels 110 passing through the heat exchanger portion 112 and a second group of heat transfer channels 110 passing through the heat exchanger portion 112' positioned opposite the first heat exchanger 112 relative to the inlet manifold 105. The coolant can flow through the first group and the second group of heat transfer channels 110 to the corresponding outwardly positioned plenum regions 117. As shown in FIG. 6, the respective plenum regions 117 can be positioned outwardly of the heat exchanger portions 112, 112' relative to the inlet manifold 105. From the plenum regions 117, the coolant can be distributed among respective groups of return heat-transfer channels 120 and flow through those channels into an exhaust (or outlet) manifold 125. The exhaust manifold 125 can be positioned adjacent the inlet manifold 105, and separated therefrom by a wall 107, as shown schematically in FIG. 4.

Example 6

Heat Exchanger Portion

FIG. 7 shows a partially cut-away view of a heat exchanger portion 112 of a manifolded heat exchanger 100 of the type described above in connection with FIGS. 4, 5 and 6. As shown in FIG. 7, the heat transfer channels 110 and the heat transfer channels 120 can be configured as finned tubes. In other words, each heat transfer channel 110, 120 can have an elongate conduit extending between and fluidly coupling together the respective inlet or outlet manifold 105, 125 and a corresponding turning plenum 115 (FIG. 4). The coolant associated with the second fluid circuit 60 can flow through an interior region of the conduits.

In the example shown in FIG. 7, a plurality of annular fins 113 encircles each conduit of the heat transfer channels 110, 120. The annular fins are thermally coupled to an outer surface of the conduits of the heat transfer channels to facilitate heat exchange between a fluid external to the conduits and the wall of the conduits (and thus a fluid internal to the conduits).

The heat exchanger portion 112 (and portion 112') can also include a plurality of baffles (or walls) configured to direct relatively warmer coolant associated with the first fluid circuit 50 from the respective inlets 41 to the respective outlets 31. As but one of many possible baffle configurations, the illustrated heat exchanger portion 112 has a generally planar wall 141 extending partially between the opposed first and second sides (shown in FIGS. 5 and 6, respectively) of the manifolded heat exchanger 100, and between the manifold region 104 and the plenum region 117. The wall 141 extends from the wall 140 defining the first side of the manifolded heat exchanger 100 toward a wall defining the opposed second side.

A plurality of walls 141a, 141b, 141c, 141d can extend laterally outwardly of the wall 141. For example, opposed walls 141a, 141d can extend laterally outwardly of the wall 141 in a region adjacent the wall 140 defining the first side of the manifolded heat exchanger 100. The walls 141a, 141d can be inwardly spaced from the wall 140 to define, respectively, an inlet manifold region 130 and an outlet manifold region 135 in the first fluid circuit 50. Between the walls 141a, 141d and the wall (not shown in FIG. 7) forming the second side of the manifolded heat exchanger 100, walls 141b and 141c can extend laterally outward from the wall 141.

Figure 9:
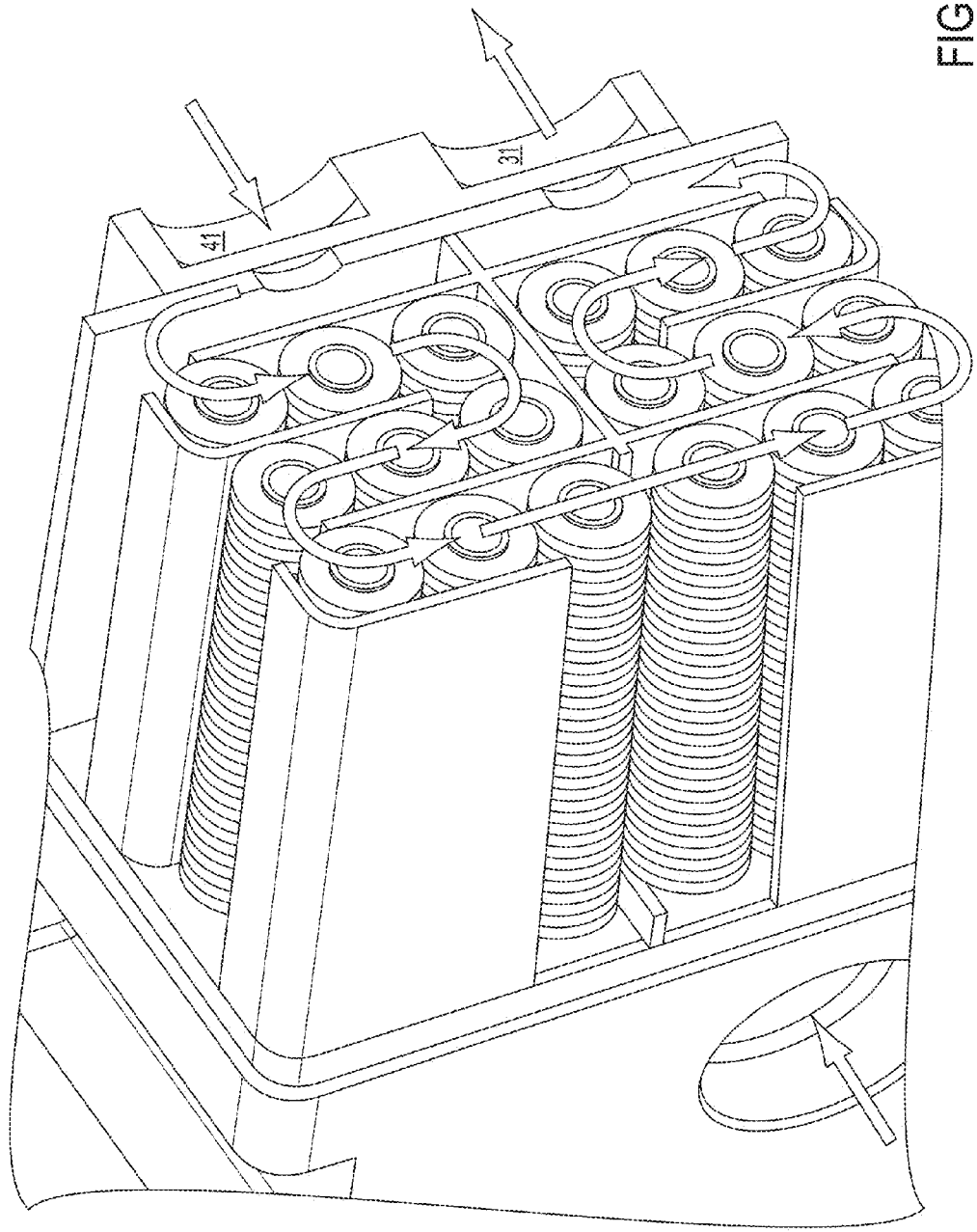

A second plurality of walls 143a, 143b, 143c, 143d can be juxtaposed with the walls 141a, 141b, 141c, 141d. As shown in FIG. 7, adjacent pairs of the juxtaposed walls (e.g., 141a and 143a, 143a and 141b, etc.) can be spaced apart from each other to define respective gaps 142a, 142b, 142c, 142d, 142e, 142f through which coolant associated with the first fluid circuit 50 can flow. The arrows shown in FIG. 9 illustrate a circuitous path taken by the coolant between the inlet 41 and the outlet 31 in the embodiment of the depicted manifolded heat exchanger 100.

Notably, the arrangement of baffle walls 141, 141a, 141b, 141c, 141d, 143a, 143b, 143c, 143d can direct the coolant in the first fluid circuit 50 past each of the heat transfer channels 120, 110. Moreover, the coolant passing through the inlet port 41 can be relatively warmer than the coolant passing through the outlet port 31, since the manifolded heat exchanger 100 is configured to facilitate rejection of heat 55 from the coolant to a second, relatively cooler heat-transfer medium passing through the heat-transfer channels 110, 120. And, as noted above, the heat-transfer medium entering the inlet port 101 and passing first through the heat-transfer channels 110 can be relatively cooler than the heat-transfer medium discharged through the outlet port 127. Such a counter-flow arrangement of flow paths between the first and the second fluid circuits 50, 60 can help ensure a relatively higher heat-exchanger efficiency insofar as such an arrangement can maintain a relatively higher average bulk temperature difference between the coolant (first fluid circuit 50) and the heat-transfer medium (second fluid circuit 60) throughout the heat exchanger portions 112, 112'.

EXAMPLE 7

Heat-Transfer Channels

Other finned-tube or finned channel 110, 120 configurations than those shown in FIG. 7 are possible. For example, rather than being generally circular as shown in FIG. 7, the conduits of the heat transfer channels 110, 120 can have a different cross-sectional shape, e.g., an oval, a square, a rectangle, an elipse, as shown for example in FIG. 7A.

Figure 7A:
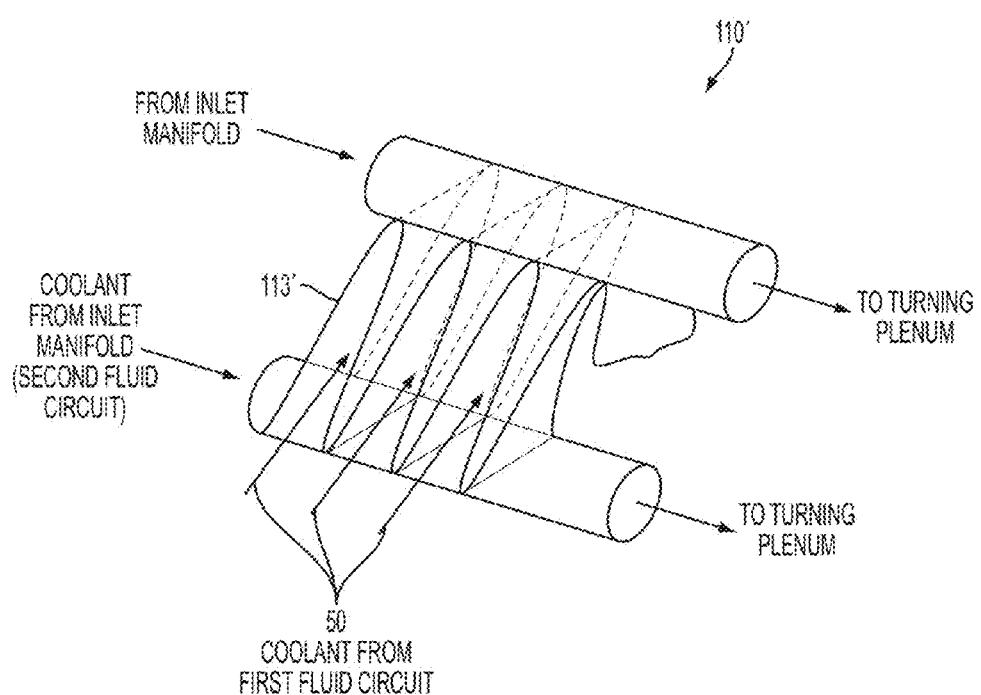
FIG. 7A shows an alternative arrangement of heat transfer channels within a heat-exchanging manifold.
Figure 8:
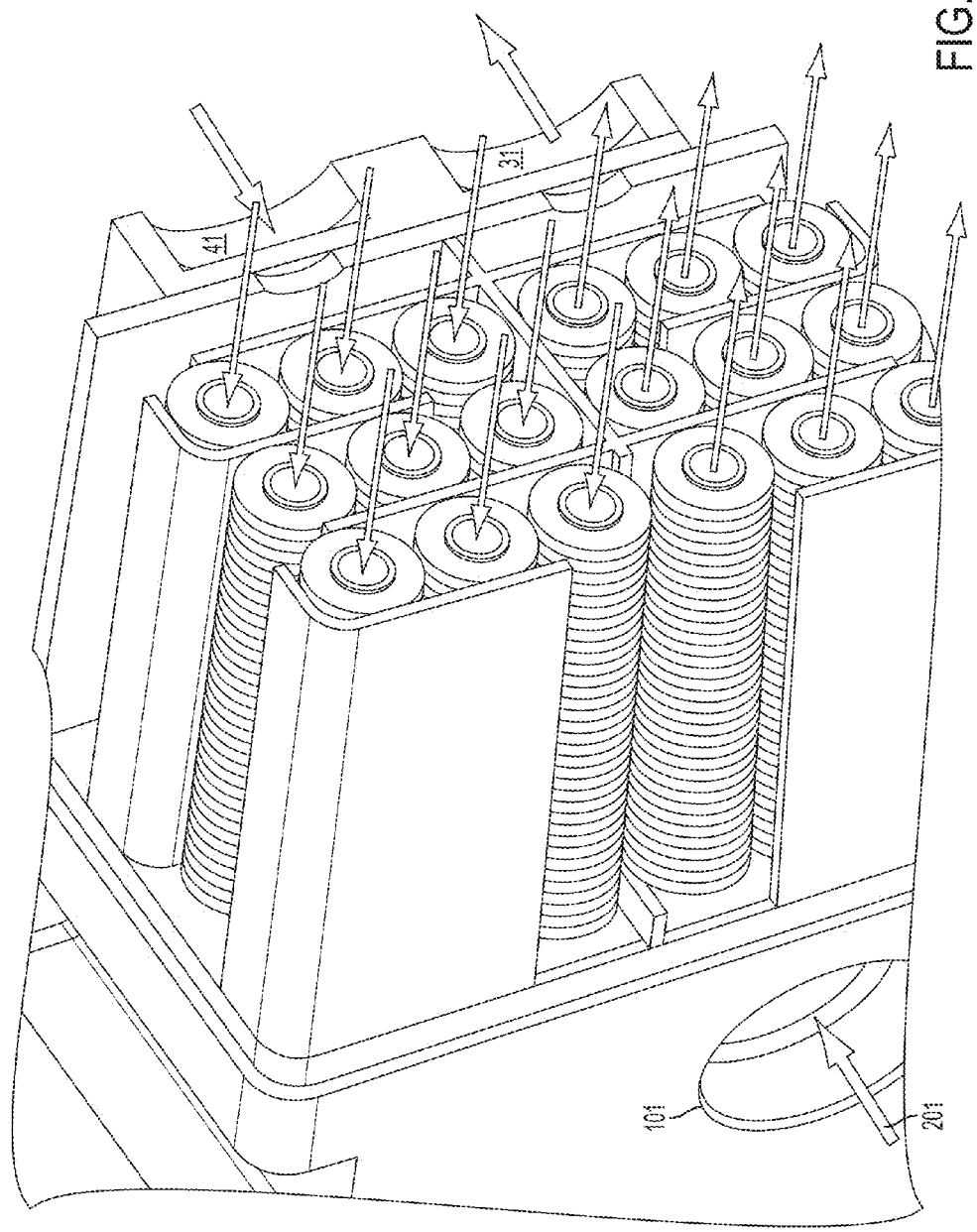

And, the fins 113 can have a different configuration than that shown in FIG. 7. For example the fins can have a unitary construction forming a spiral fin structure encircling each of the conduits. Alternatively, as shown in FIG. 7A, a folded fin structure (e.g., a corrugated fin 113') can thermally couple to and extend between adjacent conduits of the heat transfer channels 110'. The coolant associated with the first fluid circuit 50 can pass over the corrugated fins and transfer heat 55 to the relatively cooler heat-transfer medium within the conduits of the heat-transfer channels.

Example 8

Second Working Embodiment

Figure 10:
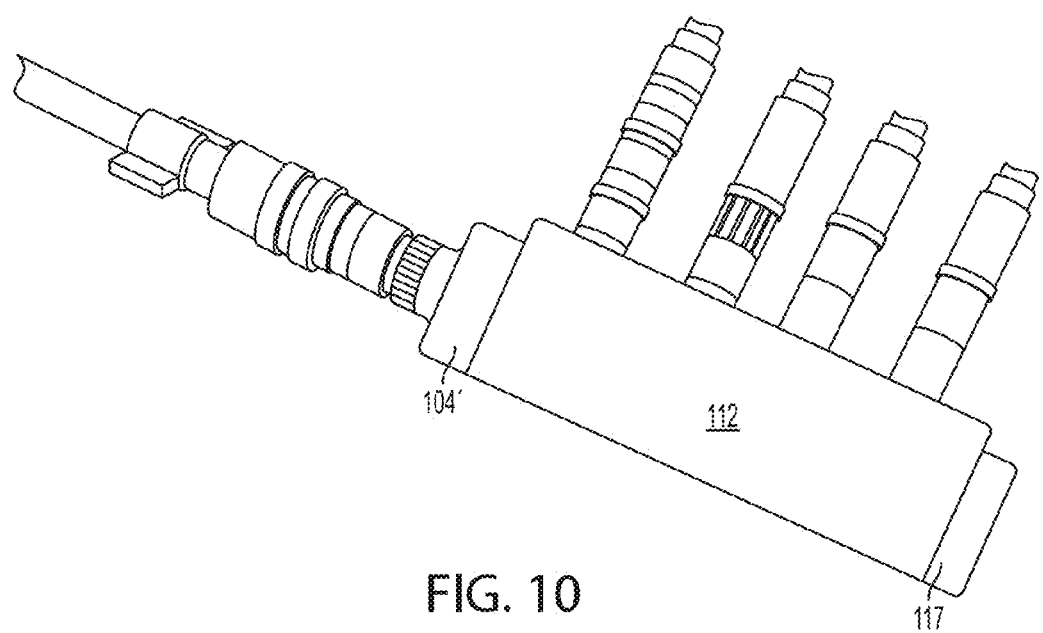
FIG. 10 shows a line drawing reproduction of a photograph of another working embodiment of a heat-exchanging manifold.

An alternative manifolded heat exchanger embodiment is shown in FIG. 10. The alternative embodiment has one heat exchanger portion 112 and one corresponding plenum portion 117. The manifold region 104' in the alternative embodiment divides an incoming flow of, for example, relatively cooler facility water (e.g., tap water as shown in FIG. 10) among a plurality of heat transfer channels 110, as described above. However, the inlet manifold corresponding to the manifold region 104' does not divide the incoming flow between opposed, outwardly extending heat transfer channels 110 as described above in relation to the manifold region 104 shown in FIG. 4. FIG. 10 shows a plurality of heat exchange elements 20 fluidly coupled with the alternative embodiment during "bench testing" of the alternative embodiment.

EXAMPLE 9

Computing Facility

FIG. 11 shows a generalized computing facility. Compared to the computing installation 10 shown and described in relation to FIG. 3, the computing facility 250 can include a plurality of computing installations 10a, 10b. One or more other computing installations 10n can be positioned externally of the computing facility 250.

Each of the computing installations 10a, 10b . . . 10n can be configured similarly or identically to the computing installation 10 shown in FIG. 3. For example, each computing installation 10a, 10b . . . 10n can include a corresponding one or more heat dissipaters thermally coupled to a corresponding heat exchanger 21, which in turn can be fluidly coupled to a respective manifolded heat exchanger 100a, 100b . . . 100n configured as described in connection with other examples herein.

In turn, one or more of the manifolded heat exchangers 100a, 100b . . . 100n can be fluidly coupled to a facility conditioner 200. As described above, one or more of the manifolded heat exchangers 100a, 100b . . . 100n can form a portion of a second fluid circuit 60, and the working fluid within the second fluid circuit can pass through the conditioner 200. As the working fluid passes through the conditioner 200, heat 210 can be rejected to an environment 300, cooling the working fluid before it returns to the manifolded heat exchangers 100a, 100b . . . 100n to collect more heat from each of the respective manifolded heat exchangers.

The conditioner 200, in turn, can include a manifolded heat exchanger of the type described herein. For example, the environment 300 can include a third fluid circuit passing through a heat exchanger portion of the conditioner 200 to absorb the heat 210 from the second fluid circuit 60. The fluid from the environment can pass through the conditioner 200 in a similar fashion as the fluid from the second fluid circuit 60 passes through the manifolded heat exchanger 100 (e.g., through a manifold similar to the manifold region 104, into a heat exchanger portion similar to the heat exchanger portion 112, and, in some instances, into a plenum region similar to the plenum region 117 before returning to the manifold region through the heat exchanger portion). And, the fluid in the second circuit 60 from each respective manifolded heat exchanger 100a, 100b . . . 100n can enter and pass through the conditioner 200 in a manner similar as the fluid from the first fluid circuit 50 enters the heat exchanger portions 112, 112' of the manifolded heat exchanger 100.

Example 10

Heat Transfer Elements

FIG. 2 shows a representative heat-transfer element 20 within a representative one of the computing environments (e.g., server 25a). The representative heat-transfer element 20 can have a modular configuration (e.g., including a pair of component heat-exchangers 20a, 20b configured to cool a corresponding pair of microprocessors or other heat dissipaters (not shown)). A fluid coupler 30 can extend between an inlet to the heat-transfer element 20 and an outlet of the manifold module 100. A fluid coupler 40 can extend between an outlet from the heat transfer element 20 and an inlet to the manifold module 100.

The respective heat exchangers 21a, 21b can be fluidly coupled to each other in series relative to the manifolded heat exchanger 100, as shown in FIG. 2, or in parallel, as shown schematically in FIG. 2A. In FIG. 2, a third fluid coupler 35 extends between an outlet from the first heat exchanger 21a and an inlet to the second heat exchanger 21b. In FIG. 3, an outlet from the manifold module is fluidly coupled to each respective inlet to the heat exchangers 21a, 21b, and each respective outlet from the heat exchangers 21a, 21b is fluidly coupled to an inlet to the manifold module.

As noted above, an array of one or more heat-transfer elements 20a, 20b . . . 20n can be configured to transfer heat to or from a working fluid passing through the respective heat-transfer elements. As shown, for example, in FIGS. 2 and 2A, each heat-transfer element 20a, 20b . . . 20n can include one or more heat exchange modules (21a, 21b) configured to absorb heat from, or to reject heat to, an operable element or a component thereof.

As used herein, the terms "heat sink" and "heat exchanger" are interchangeable and mean a device configured to transfer energy to or from a fluid, as through convection (i.e., a combination of conduction and advection) or phase change of a working fluid. A heat exchange module can be a heat exchanger, or can include a heat exchanger in combination with one or more other components. For example, as described more fully below, a heat exchange module can include a duct or a housing in combination with a heat exchanger. As well, a heat exchange module can include a heat exchanger in combination with an integrated housing and a pump, together with any associated seals, gaskets and/or couplers.

Several examples of suitable heat exchange modules are described, for example, in U.S. Patent Application No. 60/954,987, filed on Aug. 9, 2007, U.S. patent application Ser. No. 12/189,476, filed on Aug. 11, 2008, U.S. Patent Application No. 61/512,379, filed on Jul. 27, 2011, U.S. patent application Ser. No. 13/401,618, filed on Feb. 21, 2012, and U.S. Patent Application No. 61/622,982, filed on Apr. 11, 2012, which patent applications are hereby incorporated by reference in their entirety, for all purposes.

As noted, some heat-transfer elements 20a, 20b . . . 20n include a plurality of heat exchange modules 21a, 21b (FIG. 2). Each in the plurality of heat exchange modules can correspond to, for example, a respective heat-dissipater, or a group of respective heat dissipaters, within a given computing environment.

In the context of a rack-mountable server having a plurality of heat-dissipating devices (e.g., microprocessors, chipsets, memory, graphics components, voltage regulators), a heat-transfer element 20a, 20b . . . 20n can include a single-phase or a two-phase heat exchange module for cooling a respective one or more devices. As used herein, "phase" refers to a thermodynamic state of a substance, e.g., a liquid phase, a gas phase, a solid phase, or a saturated mixture of liquid and gas. As used herein, a "single-phase" heat exchange module refers to a heat exchange module in which the working fluid undergoes little or no net change of phase, remaining in substantially the same phase (e.g., a liquid) as the fluid passes through the heat exchange module. As used herein, a "two-phase" heat exchange module refers to a heat exchange module in which the working fluid undergoes a change of phase (e.g., evaporation of a liquid to a gas phase or condensation of a gas to a liquid phase) as the fluid passes through the heat exchange module.

For a given mass of working fluid, a "two-phase" heat exchange module can typically absorb or reject more heat for a given change in temperature, and in some instances provide more suitable cooling or heating relative to a given temperature threshold, than a "single-phase" heat exchange module because the latent heat of vaporization (or condensation) of most working fluids is substantially greater than the specific heat of the fluid (e.g., a single-phase fluid may change temperature in proportion to the amount of absorbed or rejected heat, whereas a fluid undergoing phase-transition typically stays within a relatively narrower range of temperature as it absorbs or rejects heat).

Since a temperature and/or a phase of a given mass of working fluid can change as it passes through a first heat exchange module, the capacity of the given mass of working fluid to exchange heat as it passes through a second heat exchange module fluidicly coupled to the first heat exchanger in series may be somewhat diminished as compared to the case in which a comparable mass of working fluid enters the second heat exchange module without being heated by the first heat exchange module (e.g., assuming a temperature of the fluid and/or the downstream heat exchanger is limited by a fixed upper threshold temperature). Nonetheless, in many instances, including many equipment cooling embodiments (e.g., cooling rack-mountable servers as shown in FIG. 1), such a temperature change does not appreciably diminish the cooling capacity of a downstream heat exchanger. For example, a flow rate of the working fluid can be increased to compensate for relatively higher rates of heat dissipation by an operable element, ensuring that a temperature of a working fluid within the respective heat-transfer element 20a, 20b . . . 20n remains below an upper threshold temperature before entering a downstream heat exchanger 21b. Similarly, for relatively lower rates of heat dissipation, a flow rate of the working fluid can be decreased to a suitable level that maintains a given temperature below an upper threshold while simultaneously reducing the amount of power consumed to pump the fluid through the heat-transfer element (and/or through the system).

EXAMPLE 11

Alternative Embodiments

Apart from systems configured to cool a plurality of servers that dissipate heat during operation, some disclosed heat transfer systems can be configured to heat a plurality of devices. As but one example, a chemical processor can be configured to house a plurality of endothermic chemical reactions. An array of heat-transfer elements (similar to the heat transfer elements 20) can be configured to transfer heat to the chemical processor from a relatively warmer environment 300. For example, the conditioner 200 can be used to extract heat from the environment 300 and to heat fluid passing through the second fluid circuit 60. As the respective working fluids from the first and the second fluid circuits 50, 60 pass through a manifolded heat exchanger of the type described herein, heat can be transferred from the relatively warmer fluid in the second fluid circuit 60 to the relatively cooler fluid in the first fluid circuit 50. After discharging from the manifolded heat exchanger 100, the heated fluid in the first fluid circuit 50 can reject heat to the chemical processor.

EXAMPLE 12

Working Fluids

As used herein, "working fluid" means a fluid used for or capable of absorbing heat from a region having a relatively higher temperature, carrying the absorbed heat (as by advection) from the region having a relatively higher temperature to a region having a relatively lower temperature, and rejecting at least a portion of the absorbed heat to the region having a relatively lower temperature.

In some embodiments (e.g., endothermic chemical reactions), the environmental working fluid has a relatively higher temperature than an operable component (e.g., a reaction chamber) corresponding to a given heat-transfer element in the array 100' (FIG. 4). In other embodiments (e.g., exothermic chemical reactions, servers, lasers), the environmental working fluid has a relatively lower temperature than an operable component (e.g., a reaction chamber, an integrated circuit, a light source).

Some working fluids are sometimes also referred to as a "coolant". As used herein, "coolant" refers to a working fluid capable of being used in or actually being used in a heat-transfer system configured to maintain a region of a device at or below a selected threshold temperature by absorbing heat from the region. Although many formulations of working fluids are possible, common formulations include distilled water, ethylene glycol, propylene glycol, and mixtures thereof.

EXAMPLE 13

Equipment Module

Many varieties of apparatus can be configured to receive a plurality of operable elements. For example, an equipment enclosure, commonly referred to as an "equipment rack" or a "rack", can be configured to receive a plurality of independently operable equipment elements (e.g., servers), as shown in FIG. 1. The rack can include a manifolded heat exchanger 100. The manifolded heat exchanger can include self-sealing quick-disconnect fluid couplers. In some instances, the fluid couplers can facilitate blind mating with fluid couplers associated with heat exchange elements 20.

Although a cooling system for a rack-mounted server is described in some detail as an example of a modular heat-transfer system incorporating disclosed principles, other embodiments of heat-transfer systems are contemplated. For example, scientific instruments, telecommunications devices (e.g., routers and switches), audio equipment (e.g., amplifiers, pre-amplifier conditioning units, and audio receivers), video equipment (e.g., players), laser equipment, lighting equipment (e.g., incandescent lighting and light-emitting diodes), chemical processing equipment, biological processing equipment and other equipment, are contemplated embodiments of operable elements to which modular heat-transfer systems can be applied. Such operable elements can be received by an equipment enclosure, and such an equipment enclosure can be included in an equipment module 12.

Some commercially available equipment racks are configured to receive operable elements having a frontal area measuring about 19-inches wide and an integer-multiple of about 1.75 inches in height. An operable element's height is sometimes measured in Rack Units (commonly referred to as "U" or, less commonly, "RU"). Thus, an operable element measuring about 1.75 inches in height measures 1U in height, and is sometimes referred to as a "1U" element. Similarly, a 2U element measures about 3.5 inches in height, and a 4U element measures about 7 inches in height.

To facilitate installation in commonly available racks, many computing environments 25a, 25b . . . 25n have a front-panel height measuring about 1⁄32-inches (0.31 inches) less than the corresponding multiple of rack units. For example, a 1U element typically measures about 1.719 inches tall, rather than 1.75 inches tall, and a 2U typically measures about 3.469 inches tall instead of 3.5 inches tall. A gap above and/or below an installed piece of equipment facilitates installation and removal without mechanically interfering with adjacent equipment.

Other standardized equipment racks are also commercially available. In the telecommunications industry, for example, equipment racks commonly are configured to receive operable elements having a frontal area measuring about 23 inches wide and about 1 inch in height.

Although standardized equipment enclosures are described in some detail herein, other embodiments of equipment modules are contemplated. For example, an equipment module need not be distinct from an operable element or configured to receive an operable element to take advantage of the scalable nature of disclosed heat-transfer systems. For example, an enclosure of a mainframe- or a super-computer can include a coolant heat exchanger, manifold module and an array of heat-transfer elements as disclosed herein. In other embodiments, an equipment module can be configured as a room or a closet within a structure, or a volume within an airframe selected to house a plurality of operable elements.

EXAMPLE 14

Alternative Configurations

In some instances, modular heat transfer systems of the type described herein can be configured to cool a server or other system within an enclosure having limited or no ability to transfer air (or other fluid) across a boundary defined by the enclosure. Such enclosures configured to permit limited or no exchange of air (or other fluid) across an enclosure boundary are sometimes referred to in the art as a "sealed enclosure" despite that some such enclosures are not hermetically sealed and permit a measure of mass transfer across the enclosure boundary.

FIG. 14 shows a schematic illustration of a heat transfer system configured to cool a server 512 and its associated components mounted within a sealed enclosure 512a.

As shown in FIG. 14, a closed-loop liquid-cooling system can be positioned within a sealed enclosure 512a. The closed-loop liquid-cooling system can have a first cooling module 510 having one or more component heat-transfer modules 520, 530 of the type shown in, for example, FIG. 2. The first cooling module 510 can be configured to transfer heat from one or more high-heat-flux components (e.g., a microprocessor, as indicated by wavy line 5a in FIG. 2) to a working fluid passing through the cooling module. For example, a component heat-transfer module 520 can be thermally coupled to a respective high-heat-flux component, and heat from the respective component can be transferred to a working fluid passing through the component heat transfer module 520.

The closed-loop liquid-cooling system can have a second cooling module 550 configured to transfer heat from air (or another fluid) within the sealed enclosure 512a to a working fluid passing through the second cooling module 550. As but one example, the second cooling module 550 can be configured as an air-to-liquid heat exchanger. Such an air-to-liquid heat exchanger can include a radiator commercially available from, for example, CooliT Systems, Inc. of Calgary, Alberta. In one working embodiment, the air-to-liquid heat exchanger is configured as a cross-flow heat exchanger configured to direct a flow of relatively warmer air 570 within the sealed enclosure 512a over a plurality of extended surfaces (e.g., fins). The plurality of extended surfaces can be thermally coupled to a passage through which a relatively cooler working fluid (e.g., liquid water, propylene glycol, ethylene glycol, or a mixture thereof) passes. As the relatively warmer air passes over the extended surfaces, heat can transfer from the air to the relatively cooler working fluid passing through the module 550, cooling the air stream 570.

The closed-loop liquid-cooling system can have a third cooling module 540 configured to reject heat from the working fluid within the closed-loop liquid-cooling system. In one example, as shown in FIG. 14, the third cooling module 540 can be configured as a liquid-to-liquid heat exchanger. As indicated by the wavy arrow 511, the working fluid within the closed-loop liquid-cooling system can reject heat to a second working fluid passing through a conduit 541 in the third cooling module. The conduit 541 can be configured to augment heat transfer between a surface of the conduit and the working fluid therein. For example, the conduit can comprise one or more microchannels or other passages extending between juxtaposed fins, pins or other extended surfaces. A relatively cooler second working fluid, $T_c$, can enter the cooling module 540 from a portion 210 of the manifold module. After absorbing heat from the first working fluid in the closed-loop liquid-cooling system, the heated, relatively warmer second working fluid, $T_h$, can be exhausted from the cooling module 540 to a portion 220 of the manifold module.

In some sealed enclosure embodiments, the conduit 541 (or other heat transfer passage, e.g., microchannels) can be filled with a selected volume of the second working fluid, for example during assembly of the sealed enclosure or the associated server. In some instances, the conduit 541 can be filled before the sealed enclosure is installed in a rack or other application. The cooling module 540 can have dripless, conduit couplers 542, 543 configured to fluidicly couple the sealed server enclosure 512a to a supply of coolant. Such a prefilled, and easy-to-connect cooling module 540 can ease installation of the sealed server 512 to, for example, a manifold module 200 (or other supply of coolant for removing heat from the sealed server enclosure 512a).

An air mover 560, e.g., an axial fan, can cause air (or other fluid) to circulate within the sealed enclosure 512a. Heat can transfer from a stream of relatively warmer air 570 to the relatively cooler working fluid within the radiator 550, as indicated by arrow 551. The cooled stream of air 571 can be directed past or over one or more heated components (not shown) of the server for cooling such heated components. As the stream of air 571 passes over heated components, the cooled stream of air 571 absorbs heat. Such heated air 572 can circulate within the sealed enclosure 512a, in some instances absorbing additional heat from within the server. The heated air 573 can return to the air mover 560 and enter the air mover as the relatively warmer stream of air 570 for subsequent rejection of heat to the working fluid in the closed-loop liquid-cooling system.

The first cooling module 510 and the second cooling module 550 can be fluidicly coupled to each other. As but one example, the second cooling module 550 can be fluidicly coupled with the first cooling module 510 in series. As shown in FIG. 13, the second cooling module 550 can be fluidicly coupled to the first cooling module 510 upstream of the first cooling module. In other embodiments, the first cooling module 510 can be fluidicly coupled to the second cooling module 550 upstream of the second cooling module.

In the embodiment shown in FIG. 14, a flow of relatively cool working fluid can pass from the cooling module 540 within a conduit 513 of the closed-loop liquid-cooling system to the second cooling module 550. As noted above and indicated by the arrow 551, the working fluid within the second cooling module 550 can absorb heat from a stream of relatively warmer air 570. The heated working fluid can pass from the module 550 into a conduit 514 and enter the module 510.

The module 510 can include a component heat exchanger 520 thermally coupled to and configured to absorb heat from a heated component. In some instances, the module 510 includes one or more other similar component heat exchangers 530, each being thermally coupled to and configured to absorb heat from a respective heated component. Heat absorbed from the heated components can be transferred to the working fluid passing through the component heat exchanger(s) 520, 530, further heating the working fluid previously heated as it passed through the module 530.

Each component heat exchanger 520, 530 can include a centrifugal or other pump, as noted in connection with the component heat exchangers 120a, 120b shown in and described in relation to FIG. 2. The pumps within the component heat exchangers 520, 530 can, in some embodiments, urge the working fluid to circulate throughout the closed-loop liquid-cooling system comprising the modules 510, 540 and 550. In some embodiments, such a closed-loop liquid-cooling system can have no other pumps, though other embodiments can include a pump external to the heat transfer modules 520, 530 (e.g., if an additional measure of redundancy is desired beyond that provided by the internal pumps of the modules 520, 530). Nonetheless, in a closed-loop liquid-cooling system of the type just described, the pumps within the component heat exchangers 520, 530 can provide a measure of redundancy insofar as the working fluid can continue to circulate throughout the closed-loop liquid-cooling system even if only one pump remains in service (e.g., if one or more other pumps fails), since the component heat exchangers 520, 530 are fluidly coupled to each other in series.

In the embodiment shown in FIG. 14, the heated working fluid can pass from the module 510 into a return conduit 515 extending between an outlet of the module 510 and an inlet to the module 540. Heat absorbed by the working fluid within the modules 550 and 510 can be rejected from the working fluid to the second working fluid as they pass through the module 540.

As indicated by the alternative module configuration 510a shown in FIG. 15, the component heat exchangers 520, 530 can be fluidicly coupled to each other in parallel. In such an embodiment, the conduit 514 can divide into separate conduits 514a, 514b fluidicly coupled to respective inlets of the heat exchangers 520, 530. The working fluid exhausted from the heat exchangers 520, 530 can pass through respective conduits 515a, 515b that join into a single conduit 515. In other embodiments (not shown), one or more component heat exchangers can be fluidly coupled in parallel with, for example, a pair of other component heat exchangers, while the pair of component heat exchangers can be fluidicly coupled with each other in series.

As FIG. 16 illustrates, the module 550 can be fluidicly coupled in parallel with one or more component heat exchangers (e.g., as arranged in modules 510, 510a). In such an embodiment, the conduit 513 containing relatively cooler working fluid can divide into (A) a conduit 513a fluidicly coupled to an inlet to the air-to-liquid heat exchanger 550; and (B) a conduit 513b fluidicly coupled to an inlet to a module 510 or 510a. The working fluid heated by the air-to-liquid heat exchanger 550 can pass through a conduit 514a and the working fluid heated by the module 510 or 510a can pass through a conduit 515a. The conduits 514a, 515a can join to combine the respective flows of working fluid into a conduit 516. The conduit 516 can return the heated working fluid to the module 540.

Systems in sealed enclosures 512a as just described can also include one or more sensors operatively coupled to a control system for monitoring and/or controlling operation of one or more components of the closed-loop liquid-cooling system. Such sensors and control systems include those described herein, as well as leak detection systems of the type described in, for example, U.S. Patent Application No. 61/793,479.

EXAMPLE 15

Sensors and Leak Detectors

As will be readily apparent to those of ordinary skill in the art, aspects of leak detectors and associated systems described in U.S. patent application No. 61/793,479, filed on Mar. 15, 2013, the entire contents of which are incorporated herein by reference, for all purposes, can also be combined with one or more aspects of presently disclosed modular heat transfer systems, including, but not limited to, sealed server systems.

EXAMPLE 16

Computing Environments

FIG. 13 illustrates a generalized example of a suitable computing environment 1100 in which described methods, embodiments, techniques, and technologies may be implemented. The computing environment 1100 is not intended to suggest any limitation as to scope of use or functionality of the technology, as the technology may be implemented in diverse general-purpose or special-purpose computing environments. For example, the disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices.

With reference to FIG. 13, the computing environment 1100 includes at least one central processing unit 1110 and memory 1120. In FIG. 13, this most basic configuration 1130 is included within a dashed line. The central processing unit 1110 executes computer-executable instructions and may be a real or a virtual processor. In a multi-processing system, multiple processing units execute computer-executable instructions to increase processing power and as such, multiple processors can be running simultaneously. The memory 1120 may be volatile memory (e.g., registers, cache, RAM), non-volatile memory (e.g., ROM, EEPROM, flash memory, etc.), or some combination of the two. The memory 1120 stores software 1180 that can, for example, implement one or more of the innovative technologies described herein. A computing environment may have additional features. For example, the computing environment 1100 includes storage 1140, one or more input devices 1150, one or more output devices 1160, and one or more communication connections 1170. An interconnection mechanism (not shown) such as a bus, a controller, or a network, interconnects the components of the computing environment 1100. Typically, operating system software (not shown) provides an operating environment for other software executing in the computing environment 1100, and coordinates activities of the components of the computing environment 1100.

The storage 1140 may be removable or non-removable, and includes magnetic disks, magnetic tapes or cassettes, CD-ROMs, CD-RWs, DVDs, or any other medium which can be used to store information and which can be accessed within the computing environment 1100. The storage 1140 stores instructions for the software 1180, which can implement technologies described herein.

The input device(s) 1150 may be a touch input device, such as a keyboard, keypad, mouse, pen, or trackball, a voice input device, a scanning device, or another device, that provides input to the computing environment 1100. For audio, the input device(s) 1150 may be a sound card or similar device that accepts audio input in analog or digital form, or a CD-ROM reader that provides audio samples to the computing environment 1100. The output device(s) 1160 may be a display, printer, speaker, CD-writer, or another device that provides output from the computing environment 1100.

The communication connection(s) 1170 enable communication over a communication medium (e.g., a connecting network) to another computing entity. The communication medium conveys information such as computer-executable instructions, compressed graphics information, or other data in a modulated data signal. The data signal can include information pertaining to a physical parameter observed by a sensor or pertaining to a command issued by a controller, e.g., to invoke a change in an operation of a component in the computing environment 1100.

EXAMPLE 17

Other Exemplary Embodiments

The examples described above generally concern modular heat-transfer systems configured to exchange heat between a region of relatively higher temperature and a region of relatively lower temperature. Other embodiments than those described above in detail are contemplated based on the principles disclosed herein, together with any attendant changes in configurations of the respective apparatus described herein. Incorporating the principles disclosed herein, it is possible to provide a wide variety of modular systems configured to transfer heat. For example, disclosed systems can be used to transfer heat to or from components in a data center, laser components, light-emitting diodes, chemical reactions, photovoltaic cells, solar collectors, and a variety of other industrial, military and consumer devices now known and hereafter developed. Moreover, each example described herein can be used in combination with one or more other examples described herein to arrive at a variety of heat-transfer system arrangements, such as thermoelectric coolers, refrigeration systems, and systems using air cooling of peripheral components, as but several from among many possible examples.

Directions and references (e.g., up, down, top, bottom, left, right, rearward, forward, etc.) may be used to facilitate discussion of the drawings but are not intended to be limiting. For example, certain terms may be used such as "up," "down,", "upper," "lower," "horizontal," "vertical," "left," "right," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" surface can become a "lower" surface simply by turning the object over. Nevertheless, it is still the same surface and the object remains the same. As used herein, "and/or" means "and" or "or", as well as "and" and "or." Moreover, all patent and non-patent literature cited herein is hereby incorporated by references in its entirety for all purposes.

The principles described above in connection with any particular example can be combined with the principles described in connection with any one or more of the other examples. Accordingly, this detailed description shall not be construed in a limiting sense, and following a review of this disclosure, those of ordinary skill in the art will appreciate the wide variety of fluid heat exchange systems that can be devised using the various concepts described herein. Moreover, those of ordinary skill in the art will appreciate that the exemplary embodiments disclosed herein can be adapted to various configurations without departing from the disclosed principles.

The previous description of the disclosed embodiments is provided to enable any person skilled in the art to make or use the disclosed innovations. Various modifications to those embodiments will be readily apparent to those skilled in the art, and the generic principles defined herein may be applied to other embodiments without departing from the spirit or scope of this disclosure. Thus, the claimed inventions are not intended to be limited to the embodiments shown herein, but are to be accorded the full scope consistent with the language of the claims, wherein reference to an element in the singular, such as by use of the article "a" or "an" is not intended to mean "one and only one" unless specifically so stated, but rather "one or more". All structural and functional equivalents to the elements of the various embodiments described throughout the disclosure that are known or later come to be known to those of ordinary skill in the art are intended to be encompassed by the features described and claimed herein. Moreover, nothing disclosed herein is intended to be dedicated to the public regardless of whether such disclosure is explicitly recited in the claims. No claim element is to be construed under the provisions of 35 USC 112, sixth paragraph, unless the element is expressly recited using the phrase "means for" or "step for".

Thus, in view of the many possible embodiments to which the disclosed principles can be applied, it should be recognized that the above-described embodiments are only examples and should not be taken as limiting in scope. We therefore reserve to the right to claim all that comes within the scope and spirit of the foregoing description, including any and all combinations of features described herein, and all that comes within the scope and spirit of the following claims as presently presented or amended in the future.

We presently claim:

1. A manifolded heat exchanger comprising:
   a heat exchange chamber having a plurality of inlets configured to receive a working fluid of a first fluid circuit and a plurality of outlets configured to discharge the working fluid of the first fluid circuit;
   an inlet manifold configured to receive a working fluid of a second fluid circuit, wherein the inlet manifold is fluidly isolated from the heat exchange chamber;
   a plurality of heat transfer channels extending through the heat exchange chamber and fluidly coupled to the inlet manifold, such that the working fluid from the second fluid circuit and the working fluid from the first fluid circuit are thermally coupled with each other; and
   an outlet manifold fluidly coupled to the plurality of heat transfer channels such that the outlet manifold is configured to discharge the working fluid of the second fluid circuit.

2. A manifolded heat exchanger according to claim 1, further comprising a plurality of extended surfaces extending from each of the heat transfer channels.

3. A manifolded heat exchanger according to claim 1, wherein the heat exchange chamber comprises a first heat exchange chamber, the manifolded heat exchanger further comprising a second heat exchange chamber positioned opposite the first heat exchange chamber relative to the inlet manifold.

4. A manifolded heat exchanger according to claim 3, wherein the plurality of heat transfer channels extending through the heat exchange chamber comprises a first plurality of heattransfer channels extending through the first heat exchange chamber, the manifolded heat exchanger further comprising a second plurality of heat transfer channels extending through the second heat exchange chamber.

5. A manifolded heat exchanger according to claim 4, further comprising a pair of opposed turning plenums, with one being positioned outwardly of one of the heat exchange chambers relative to the inlet manifold and the other turning plenum being positioned outwardly of the other of the heat exchange chambers relative to the inlet manifold.

6. A manifolded heat exchanger according to claim 1, further comprising a turning plenum positioned outwardly of the heat exchange chamber relative to the inlet manifold, wherein the plurality of heat transfer channels comprises a first plurality of heat transfer channels extending between and fluidly coupling the inlet manifold and the turning plenum to each other, wherein the plurality of heat transfer channels further comprises a second plurality of heat transfer channels extending between and fluidly coupling the turning plenum and the outlet manifold to each other.

7. A manifolded heat exchanger according to claim 6, wherein each of the heat transfer channels in the first plurality of heat transfer channels and each of the heat transfer channels in the second plurality of heat transfer channels comprises a plurality of extended surfaces extending therefrom.

8. A manifolded heat exchanger according to claim 1, wherein the heat exchanger chamber defines a plurality of inlet ports and a plurality of outlet ports fluidly coupled with each other and arranged to permit a flow of a working fluid to pass over theplurality of heat transfer channels as the working fluid passes from the inlet ports to the outlet ports.

9. A manifolded heat exchanger according to claim 6, wherein the heat exchanger chamber defines a plurality of inlet ports and a plurality of outlet ports fluidly coupled with each other and arranged to permit a flow of a working fluid to pass over the plurality of heat transfer channels as the working fluid passes from the inlet ports to the outlet ports.

10. A manifolded heat exchanger according to claim 8, further comprising one or more baffles positioned in the heat exchanger chamber, wherein the one or more baffles is so positioned relative to the plurality of heat transfer channels as to direct a flow of the working fluid in the first fluid circuit past one or more of the plurality of heat transfer channels.

11. A manifolded heat exchanger according to claim 9, further comprising one or more baffles positioned in the heat exchanger chamber, wherein the one or more baffles is so positioned relative to the plurality of heat transfer channels as to direct a flow of the working fluid past one or more of the plurality of heat transfer channels.

12. A manifolded heat exchanger according to claim 1, wherein the inlet manifold configured to receive a working fluid of a second fluid circuit is configured to divide an incoming flow of the working fluid into first and second flow paths having opposed bulk flow directions.

13. A manifolded heat exchanger according to claim 12, wherein the heat exchange chamber comprises a first heat exchange chamber, the manifolded heat exchanger further comprising a second heat exchange chamber positioned opposite the first heat exchange chamber relative to the inlet manifold, and the plurality of heat transfer channels extending through the heat exchange chamber comprises a first plurality of heat transfer channels extending through the first heat exchange chamber, the manifolded heat exchanger further comprising a second plurality of heat transfer channels extending through the second heat exchange chamber and fluidly coupled to the inlet manifold.

14. A manifolded heat exchanger according to claim 13, wherein the outlet manifold is fluidly coupled with the first plurality of heat transfer channels and the second plurality of heat transfer channels.

15. A cooling system for a computing environment, comprising:
a plurality of heat exchange elements configured to facilitate heat transfer from a heat dissipater to a working fluid of a first fluid circuit, each heat exchange element having a corresponding inlet and a corresponding outlet;
a heat exchanging manifold comprising:
a heat exchange chamber having a plurality of inlets configured to receive the working fluid of the first fluid circuit from an outlet of one or more of the heat transfer elements, and a plurality of outlets configured to discharge the working fluid of the first fluid circuit to an inlet of one or more of the heat transfer elements;
an inlet manifold configured to receive a working fluid of a second fluid circuit, wherein the inlet manifold is fluidly isolated from the heat exchange chamber;
a plurality of heat transfer channels extending through the heat exchange chamber and fluidly coupled to the inlet manifold, such that the working fluid from the second fluid circuit and the working fluid from the first fluid circuit are thermally coupled with each other such that the working fluid of the second fluid circuit can absorb some or all of the heat absorbed by the working fluid of the first fluid circuit in one or more of the heat exchange modules; and
an outlet manifold fluidly coupled to the plurality of heat transfer channels such that the outlet manifold is configured to discharge heated working fluid of the second fluid circuit.

16. A cooling system according to claim 12, further comprising a conditioner configured to reject heat from the working fluid of the second fluid circuit to an environment.

17. A cooling system according to claim 15, wherein the heat exchange chamber comprises a first heat exchange chamber, the heat exchanging manifold further comprising a second heat exchange chamber having a corresponding second plurality of inlets configured to receive the working fluid of the first fluid circuit and a plurality of outlets configured to discharge the working fluid of the first fluid circuit, wherein the second heat exchange chamber is positioned opposite the first heat exchange chamber relative to the inlet manifold.

18. A cooling system according to claim 15, wherein the inlet manifold configured to receive a working fluid of a second fluid circuit is configured to divide an incoming flow of the working fluid into first and second flow paths having opposed bulk flow directions.

19. A cooling system according to claim 15, wherein the heat exchange chamber comprises a first heat exchange chamber, the heat exchanging manifold further comprising a second heat exchange chamber positioned opposite the first heat exchange chamber relative to the inlet manifold, and the plurality of heat transfer channels extending through the first heat exchange chamber comprises a first plurality of heat transfer channels, the heat exchanging manifold further comprising a second plurality of heat transfer channels extending through the second heat exchange chamber and fluidly coupled to the inlet manifold.

20. A cooling system according to claim 15, wherein the outlet manifold is fluidly coupled with the first plurality of heat transfer cannels and the second plurality of heat transfer channels.

* * * * *